United States Patent
Lee et al.

(10) Patent No.: US 10,084,567 B2
(45) Date of Patent: Sep. 25, 2018

(54) EARLY TERMINATION IN ENHANCED MULTIMEDIA BROADCAST-MULTICAST SERVICE RECEPTION

(71) Applicant: QUALCOMM Incorporated, San Diego, CA (US)

(72) Inventors: Kuo-Chun Lee, San Diego, CA (US); Sivaramakrishna Veerepalli, San Diego, CA (US); Jack Shyh-hurng Shauh, San Diego, CA (US); Shailesh Maheshwari, San Diego, CA (US); Daniel Amerga, San Diego, CA (US); Ralph Akram Gholmieh, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 272 days.

(21) Appl. No.: 15/011,939

(22) Filed: Feb. 1, 2016

(65) Prior Publication Data

US 2016/0261367 A1    Sep. 8, 2016

Related U.S. Application Data

(60) Provisional application No. 62/128,181, filed on Mar. 4, 2015.

(51) Int. Cl.
*H04L 1/00* (2006.01)
*H04L 12/18* (2006.01)
(Continued)

(52) U.S. Cl.
CPC ........ *H04L 1/0041* (2013.01); *H03M 13/353* (2013.01); *H04L 1/004* (2013.01);
(Continued)

(58) Field of Classification Search
None
See application file for complete search history.

(56) References Cited

U.S. PATENT DOCUMENTS

| 7,257,760 B2 * | 8/2007 | Rick ..................... H04W 68/00 714/760 |
| 8,625,455 B2 * | 1/2014 | Todd .................. H04N 7/17318 370/252 |

(Continued)

FOREIGN PATENT DOCUMENTS

| WO | WO-2005099162 A2 | 10/2005 |
| WO | WO-2007000627 A1 | 1/2007 |
| WO | WO-2009100730 A1 | 8/2009 |

OTHER PUBLICATIONS

International Search Report and Written Opinion—PCT/US2016/016121—ISA/EPO—dated May 3, 2016.

*Primary Examiner* — Justin R Knapp
(74) *Attorney, Agent, or Firm* — Anthony R. Morris

(57) ABSTRACT

Early termination of enhanced multimedia broadcast-multicast service (eMBMS) is discussed. Forward error correction (FEC) redundancy data is added to broadcast data, such that if enough of the data symbols are successfully received, the data object may be reassembled before the entire transmission has been received. The aspects involve an application processor and modem processor, which may either be integrated into the same integrated circuit or separate components. The application processor obtains a total number of source symbols and a redundancy level for a data object to be received from the eMBMS, receives the successfully received data symbols from the modem processor, and then determines whether the number of successfully received data symbols exceeds a threshold for reassembling the (Continued)

transmitted data object. If so, then the application processor and/or the modem processor can shut down until the next broadcast.

24 Claims, 13 Drawing Sheets

(51) Int. Cl.
*H03M 13/35* (2006.01)
*H04N 21/00* (2011.01)
*H04W 4/06* (2009.01)

(52) U.S. Cl.
CPC ............ *H04L 12/18* (2013.01); *H04L 12/189* (2013.01); *H04N 21/00* (2013.01); *H04L 1/0051* (2013.01); *H04W 4/06* (2013.01)

(56) References Cited

U.S. PATENT DOCUMENTS

| | | | |
|---|---|---|---|
| 8,780,782 | B2 | 7/2014 | Amerga et al. |
| 2007/0071009 | A1* | 3/2007 | Nagaraj ................ H04L 1/0009 370/395.52 |
| 2007/0195894 | A1 | 8/2007 | Shokrollahi et al. |
| 2009/0177942 | A1 | 7/2009 | Hannuksela et al. |
| 2014/0098745 | A1 | 4/2014 | Balasubramanian et al. |
| 2014/0128454 | A1 | 5/2014 | Zhang et al. |
| 2014/0369250 | A1 | 12/2014 | Ren et al. |
| 2015/0278022 | A1 | 10/2015 | Chen et al. |
| 2017/0006634 | A1* | 1/2017 | Luo ..................... H04W 74/085 |

* cited by examiner

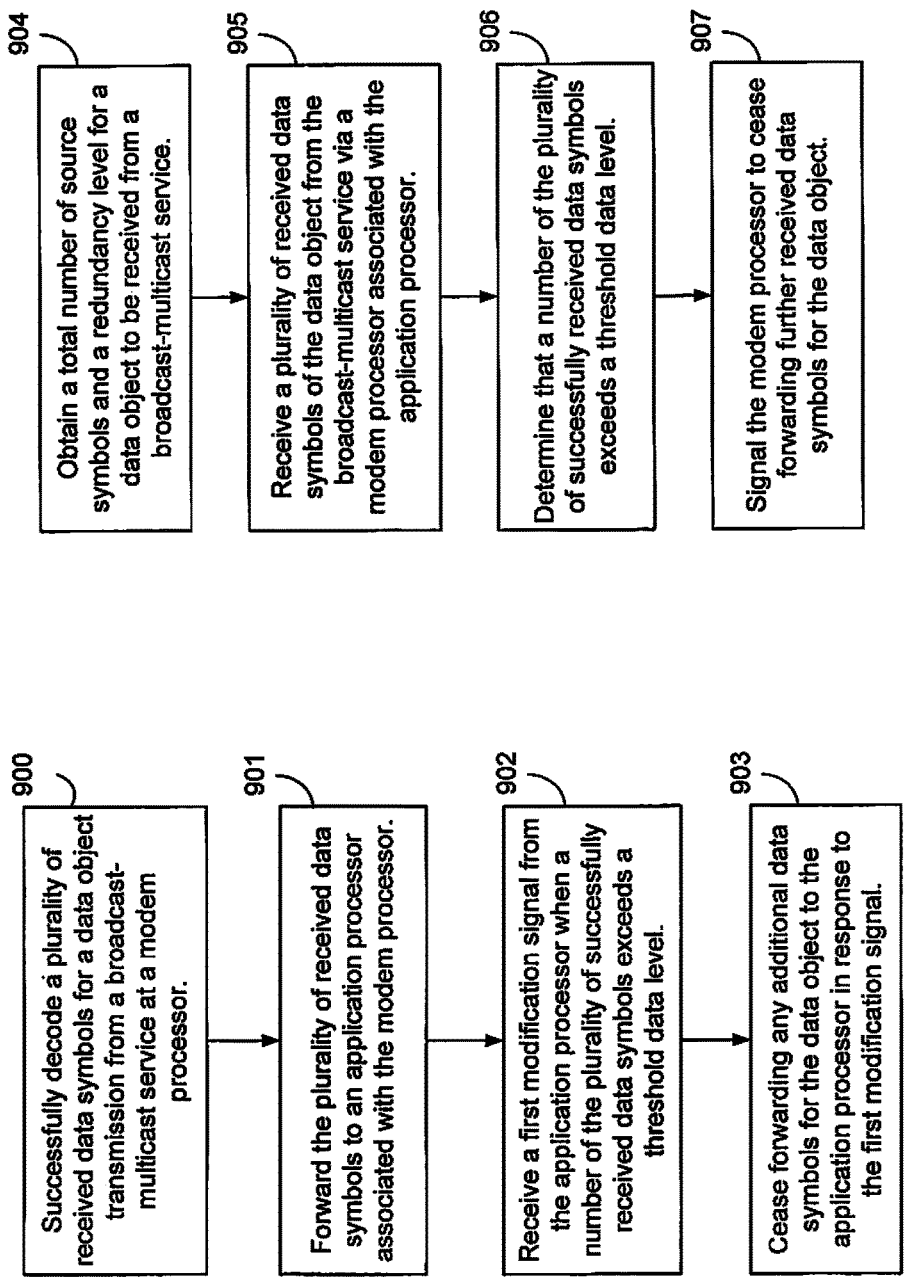

EARLY TERMINATION IN ENHANCED MULTIMEDIA BROADCAST-MULTICAST SERVICE RECEPTION

CROSS-REFERENCE TO RELATED APPLICATIONS

This application claims the benefit of U.S. Provisional Patent Application No. 62/128,181, entitled, EARLY TERMINATION IN EMBMS RECEPTION," filed on Mar. 4, 2015, which is expressly incorporated by reference herein in its entirety.

BACKGROUND

Field

Aspects of the present disclosure relate generally to wireless communication systems, and more particularly, to early termination in enhanced multimedia broadcast-multicast service (eMBMS).

Background

Wireless communication networks are widely deployed to provide various communication services such as voice, video, packet data, messaging, broadcast, etc. These wireless networks may be multiple-access networks capable of supporting multiple users by sharing the available network resources. Examples of such multiple-access networks include Code Division Multiple Access (CDMA) networks, Time Division Multiple Access (TDMA) networks, Frequency Division Multiple Access (FDMA) networks, Orthogonal FDMA (OFDMA) networks, and Single-Carrier FDMA (SC-FDMA) networks.

A wireless communication network may include a number of base stations that can support communication for a number of user equipments (UEs), also referred to as mobile entities. A UE may communicate with a base station via a downlink and an uplink. The downlink (or forward link) refers to the communication link from the base station to the UE, and the uplink (or reverse link) refers to the communication link from the UE to the base station. As used herein, a "base station" means an eNode B (eNB), a Node B, a Home Node B, or similar network component of a wireless communications system.

The 3rd Generation Partnership Project (3GPP) Long Term Evolution (LTE) represents a major advance in cellular technology as an evolution of Global System for Mobile communications (GSM) and Universal Mobile Telecommunications System (UMTS). The LTE physical layer (PHY) provides a highly efficient way to convey both data and control information between base stations, such as an evolved Node Bs (eNBs), and mobile entities, such as UEs. In prior applications, a method for facilitating high bandwidth communication for multimedia has been single frequency network (SFN) operation. SFNs utilize radio transmitters, such as, for example, eNBs, to communicate with subscriber UEs. In unicast operation, each eNB is controlled so as to transmit signals carrying information directed to one or more particular subscriber UEs. The specificity of unicast signaling enables person-to-person services such as, for example, voice calling, text messaging, or video calling.

Recent LTE versions support eMBMS in the LTE air interface to provide the video streaming and file download broadcast delivery. For example, video streaming service is expected to be transported by the DASH (Dynamic Adaptive Streaming using HTTP) protocol over FLUTE (File Delivery over Unidirectional Transport) as defined in IETF RFC 3926 over UDP/IP packets. File download service is transported by FLUTE over UDP/IP protocols. Both high layers over IP are processed by the LTE broadcast channels in PHY and L2 (including MAC and RLC layers). However, such transport includes multiple inefficiencies which are not currently addressed in the communications industry.

SUMMARY

In an aspect of the present disclosure, a method of wireless communication includes obtaining, by an application processor, a total number of source symbols and a redundancy level for a data object to be received from a broadcast-multicast service, receiving a plurality of received data symbols of the data object from the broadcast-multicast service via a modem processor associated with the application processor, determining, by the application processor, that a number of the plurality of received data symbols exceeds a threshold data level greater than the total number of source symbols and less than a total number of data symbols for transmission of the data object, wherein the total number of data symbols comprises the total number of source symbols and a total number of redundancy symbols determined by the redundancy level, and signaling the modem processor to cease forwarding further received data symbols for the data object received from the broadcast-multicast service.

In a further aspect of the present disclosure, a method of wireless communication includes successfully receiving a plurality of data symbols for a data object transmission from a broadcast-multicast service at a modem processor, forwarding the plurality of received data symbols to an application processor associated with the modem processor, receiving a first modification signal from the application processor when a number of the plurality of received data symbols exceeds a threshold data level greater than a total number of source symbols and less than a total number of data symbols for transmission of the data object, and ceasing to forward any additional data symbols for the data object to the application processor in response to the first modification signal.

In a further aspect of the present disclosure, an apparatus configured for wireless communication includes means for obtaining, by an application processor, a total number of source symbols and a redundancy level for a data object to be received from a broadcast-multicast service, means for receiving a plurality of received data symbols of the data object from the broadcast-multicast service via a modem processor associated with the application processor, means for determining, by the application processor, that a number of the plurality of received data symbols exceeds a threshold data level greater than the total number of source symbols and less than a total number of data symbols for transmission of the data object, wherein the total number of data symbols comprises the total number of source symbols and a total number of redundancy symbols determined by the redundancy level, and means for signaling the modem processor to cease forwarding further received data symbols for the data object received from the broadcast-multicast service.

In a further aspect of the present disclosure, an apparatus configured for wireless communication includes means for successfully receiving a plurality of data symbols for a data object transmission from a broadcast-multicast service at a modem processor, means for forwarding the plurality of received data symbols to an application processor associated with the modem processor, means for receiving a first modification signal from the application processor when a number of the plurality of received data symbols exceeds a threshold data level greater than a total number of source symbols and less than a total number of data symbols for transmission of the data object, and means for ceasing to forward any additional data symbols for the data object to the application processor in response to the first modification signal.

In a further aspect of the present disclosure a computer-readable medium having program code recorded thereon. This program code includes code to obtain, by an application processor, a total number of source symbols and a redundancy level for a data object to be received from a broadcast-multicast service, code to receive a plurality of received data symbols of the data object from the broadcast-multicast service via a modem processor associated with the application processor, code to determine, by the application processor, that a number of the plurality of received data symbols exceeds a threshold data level greater than the total number of source symbols and less than a total number of data symbols for transmission of the data object, wherein the total number of data symbols comprises the total number of source symbols and a total number of redundancy symbols determined by the redundancy level, and code to signal the modem processor to cease forwarding further received data symbols for the data object received from the broadcast-multicast service.

In a further aspect of the present disclosure, a computer-readable medium having program code recorded thereon. This program code includes code to successfully receive a plurality of data symbols for a data object transmission from a broadcast-multicast service at a modem processor, code to forward the plurality of received data symbols to an application processor associated with the modem processor, code to receive a first modification signal from the application processor when a number of the plurality of received data symbols exceeds a threshold data level greater than a total number of source symbols and less than a total number of data symbols for transmission of the data object, and code to cease to forward any additional data symbols for the data object to the application processor in response to the first modification signal.

In a further aspect of the present disclosure an apparatus includes at least one processor and a memory coupled to the processor. The processor is configured to obtain, by an application processor, a total number of source symbols and a redundancy level for a data object to be received from a broadcast-multicast service, to receive a plurality of received data symbols of the data object from the broadcast-multicast service via a modem processor associated with the application processor, to determine, by the application processor, that a number of the plurality of received data symbols exceeds a threshold data level greater than the total number of source symbols and less than a total number of data symbols for transmission of the data object, wherein the total number of data symbols comprises the total number of source symbols and a total number of redundancy symbols determined by the redundancy level, and to signal the modem processor to cease forwarding further received data symbols for the data object received from the broadcast-multicast service.

In a further aspect of the present disclosure, an apparatus includes at least one processor and a memory coupled to the processor. The processor is configured to successfully receive a plurality of data symbols for a data object transmission from a broadcast-multicast service at a modem processor, to forward the plurality of received data symbols to an application processor associated with the modem processor, to receive a first modification signal from the application processor when a number of the plurality of received data symbols exceeds a threshold data level greater than a total number of source symbols and less than a total number of data symbols for transmission of the data object, and to cease to forward any additional data symbols for the data object to the application processor in response to the first modification signal.

The foregoing has outlined rather broadly the features and technical advantages of the present application in order that the detailed description that follows may be better understood. Additional features and advantages will be described hereinafter which form the subject of the claims. It should be appreciated by those skilled in the art that the conception and specific aspect disclosed may be readily utilized as a basis for modifying or designing other structures for carrying out the same purposes of the present application. It should also be realized by those skilled in the art that such equivalent constructions do not depart from the spirit and scope of the present application and the appended claims. The novel features which are believed to be characteristic of aspects, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present claims.

BRIEF DESCRIPTION OF THE DRAWINGS

FIGS. 9A and 9B are block diagrams illustrating example blocks executed to implement aspects of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

The techniques described herein may be used for various wireless communication networks such as CDMA, TDMA, FDMA, OFDMA, SC-FDMA and other networks. The terms "network" and "system" are often used interchangeably. A CDMA network may implement a radio technology such as Universal Terrestrial Radio Access (UTRA), CDMA2000, etc. UTRA includes Wideband CDMA (WCDMA) and other variants of CDMA. CDMA2000 covers IS-2000, IS-95 and IS-856 standards. A TDMA network may implement a radio technology such as Global System for Mobile Communications (GSM). An OFDMA network may implement a radio technology such as Evolved UTRA (E-UTRA), Ultra Mobile Broadband (UMB), IEEE 802.11 (Wi-Fi), IEEE 802.16 (WiMAX), IEEE 802.20, Flash-OFDMA, etc. UTRA and E-UTRA are part of Universal Mobile Telecommunication System (UMTS). 3GPP Long Term Evolution (LTE) and LTE-Advanced (LTE-A) are new releases of UMTS that use E-UTRA. UTRA, E-UTRA, UMTS, LTE, LTE-A and GSM are described in documents from an organization named "3rd Generation Partnership Project" (3GPP). CDMA2000 and UMB are described in documents from an organization named "3rd Generation Partnership Project 2" (3GPP2). The techniques described herein may be used for the wireless networks and radio technologies mentioned above as well as other wireless networks and radio technologies. For clarity, certain aspects of the techniques are described below for LTE, and LTE terminology is used in much of the description below.

Figure 1:
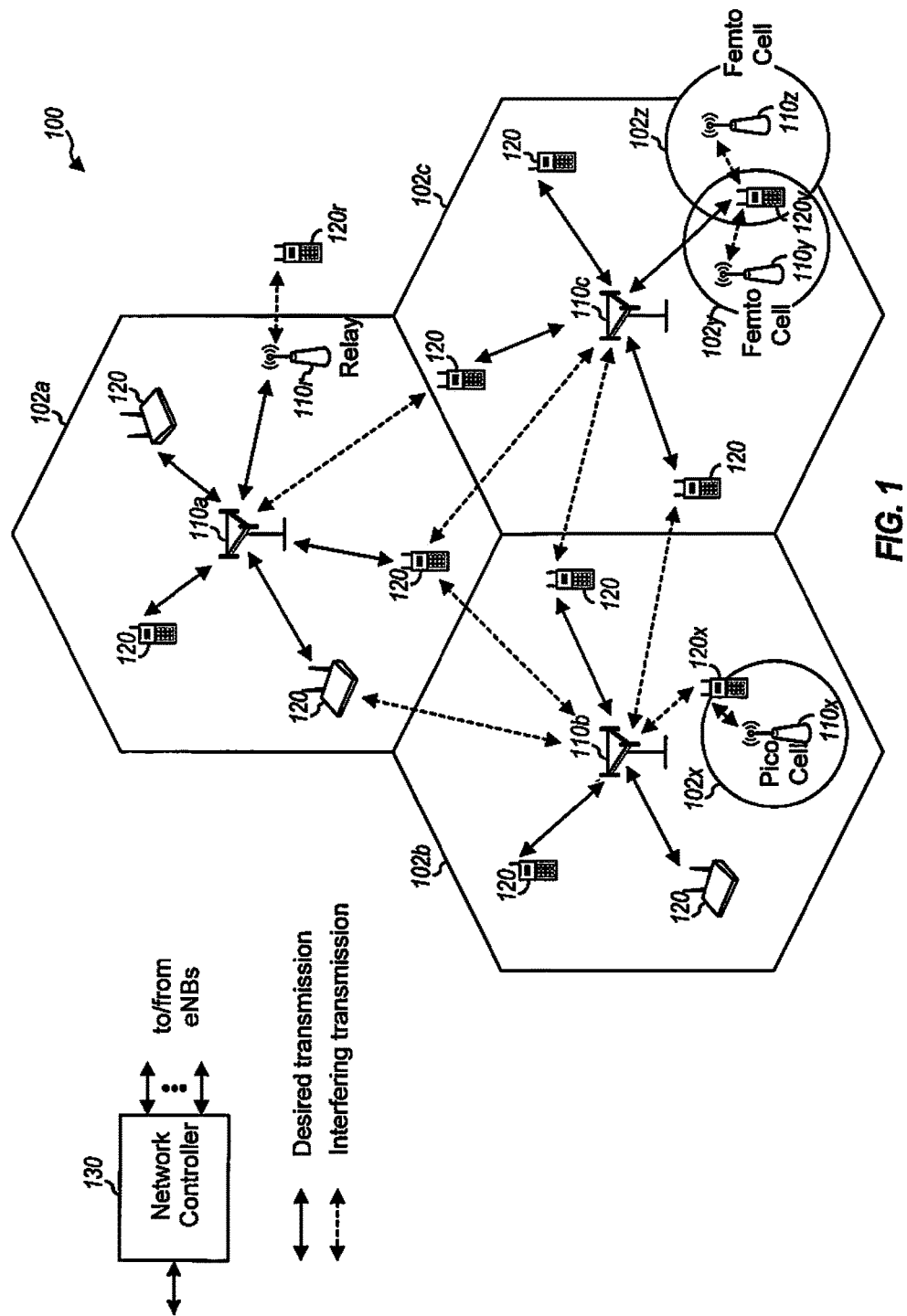
FIG. 1 is a block diagram conceptually illustrating an example of a telecommunications system.

FIG. 1 shows a wireless communication network 100, which may be an LTE network. The wireless network 100 may include a number of eNBs 110 and other network entities. An eNB may be a station that communicates with the UEs and may also be referred to as a base station, a Node B, an access point, or other term. Each eNB 110a, 110b, 110c may provide communication coverage for a particular geographic area. In 3GPP, the term "cell" can refer to a coverage area of an eNB and/or an eNB subsystem serving this coverage area, depending on the context in which the term is used.

An eNB may provide communication coverage for a macro cell, a pico cell, a femto cell, and/or other types of cell. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having association with the femto cell (e.g., UEs in a Closed Subscriber Group (CSG), UEs for users in the home, etc.). An eNB for a macro cell may be referred to as a macro eNB. An eNB for a pico cell may be referred to as a pico eNB. An eNB for a femto cell may be referred to as a femto eNB or a home eNB (HNB). In the example shown in FIG. 1, the eNBs 110a, 110b and 110c may be macro eNBs for the macro cells 102a, 102b and 102c, respectively. The eNB 110x may be a pico eNB for a pico cell 102x, serving a UE 120x. The eNBs 110y and 110z may be femto eNBs for the femto cells 102y and 102z, respectively. An eNB may support one or multiple (e.g., three) cells.

The wireless network 100 may also include relay stations 110r. A relay station is a station that receives a transmission of data and/or other information from an upstream station (e.g., an eNB or a UE) and sends a transmission of the data and/or other information to a downstream station (e.g., a UE or an eNB). A relay station may also be a UE that relays transmissions for other UEs. In the example shown in FIG. 1, a relay station 110r may communicate with the eNB 110a and a UE 120r in order to facilitate communication between the eNB 110a and the UE 120r. A relay station may also be referred to as a relay eNB, a relay, etc.

The wireless network 100 may be a heterogeneous network that includes eNBs of different types, e.g., macro eNBs, pico eNBs, femto eNBs, relays, etc. These different types of eNBs may have different transmit power levels, different coverage areas, and different impact on interference in the wireless network 100. For example, macro eNBs may have a high transmit power level (e.g., 20 Watts) whereas pico eNBs, femto eNBs and relays may have a lower transmit power level (e.g., 1 Watt).

The wireless network 100 may support synchronous or asynchronous operation. For synchronous operation, the eNBs may have similar frame timing, and transmissions from different eNBs may be approximately aligned in time. For asynchronous operation, the eNBs may have different frame timing, and transmissions from different eNBs may not be aligned in time. The techniques described herein may be used for both synchronous and asynchronous operation.

A network controller 130 may couple to a set of eNBs and provide coordination and control for these eNBs. The network controller 130 may communicate with the eNBs 110 via a backhaul. The eNBs 110 may also communicate with one another, e.g., directly or indirectly via wireless or wireline backhaul.

The UEs 120 may be dispersed throughout the wireless network 100, and each UE may be stationary or mobile. A UE may also be referred to as a terminal, a mobile station, a subscriber unit, a station, etc. A UE may be a cellular phone, a personal digital assistant (PDA), a wireless modem, a wireless communication device, a handheld device, a laptop computer, a cordless phone, a wireless local loop (WLL) station, a smart phone, a tablet, or other mobile entities. A UE may be able to communicate with macro eNBs, pico eNBs, femto eNBs, relays, or other network entities. In FIG. 1, a solid line with double arrows indicates desired transmissions between a UE and a serving eNB, which is an eNB designated to serve the UE on the downlink and/or uplink. A dashed line with double arrows indicates interfering transmissions between a UE and an eNB.

LTE utilizes orthogonal frequency division multiplexing (OFDM) on the downlink and single-carrier frequency division multiplexing (SC-FDM) on the uplink. OFDM and SC-FDM partition the system bandwidth into multiple (K) orthogonal subcarriers, which are also commonly referred to as tones, bins, etc. Each subcarrier may be modulated with data. In general, modulation symbols are sent in the frequency domain with OFDM and in the time domain with SC-FDM. The spacing between adjacent subcarriers may be fixed, and the total number of subcarriers (K) may be dependent on the system bandwidth. For example, K may be equal to 128, 256, 512, 1024 or 2048 for system bandwidth of 1.25, 2.5, 5, 10 or 20 megahertz (MHz), respectively. The system bandwidth may also be partitioned into subbands. For example, a subband may cover 1.08 MHz, and there may be 1, 2, 4, 8 or 16 subbands for system bandwidth of 1.25, 2.5, 5, 10 or 20 MHz, respectively.

Figure 2:
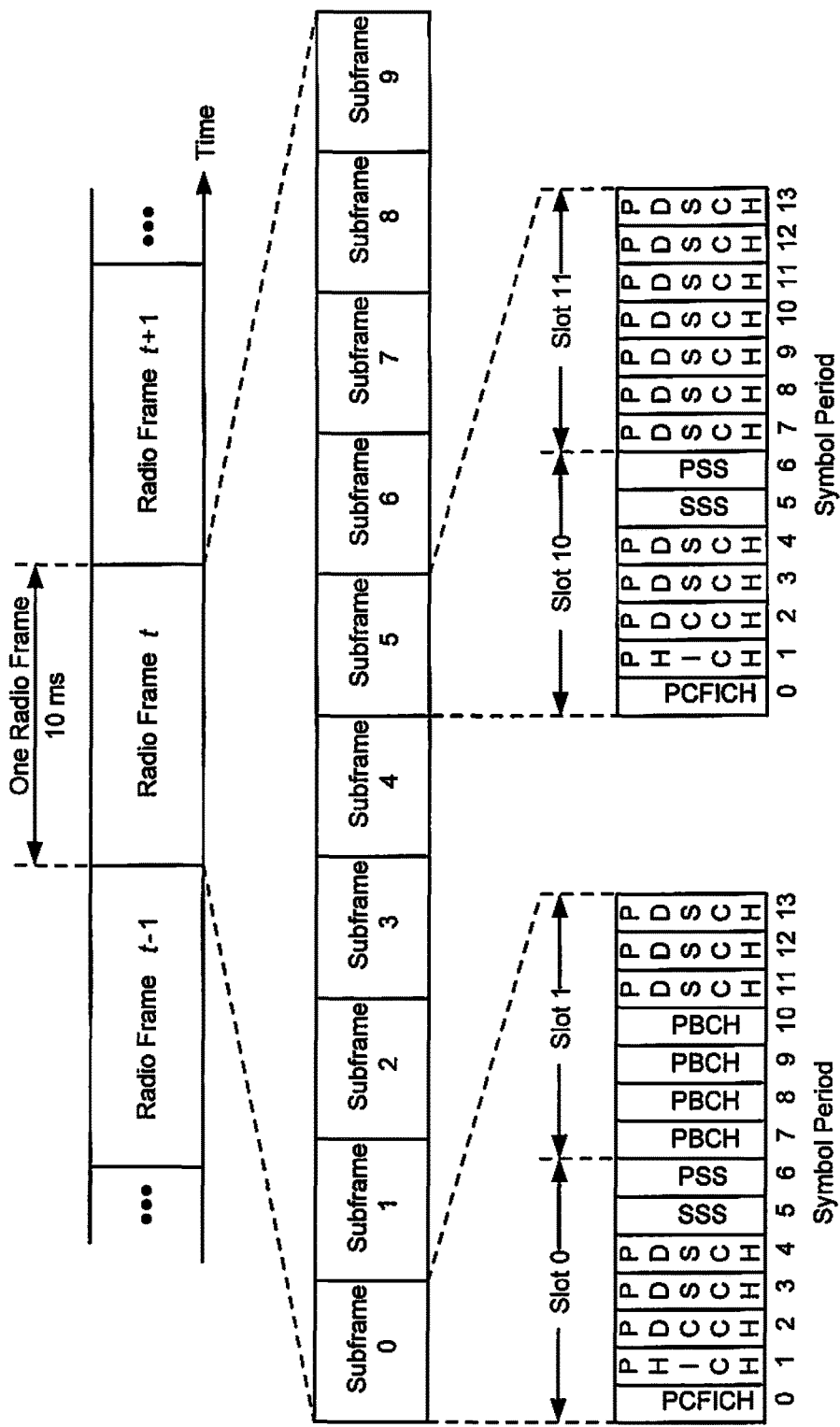
FIG. 2 is a block diagram conceptually illustrating an example of a down link frame structure in a telecommunications system.
Figure 6:
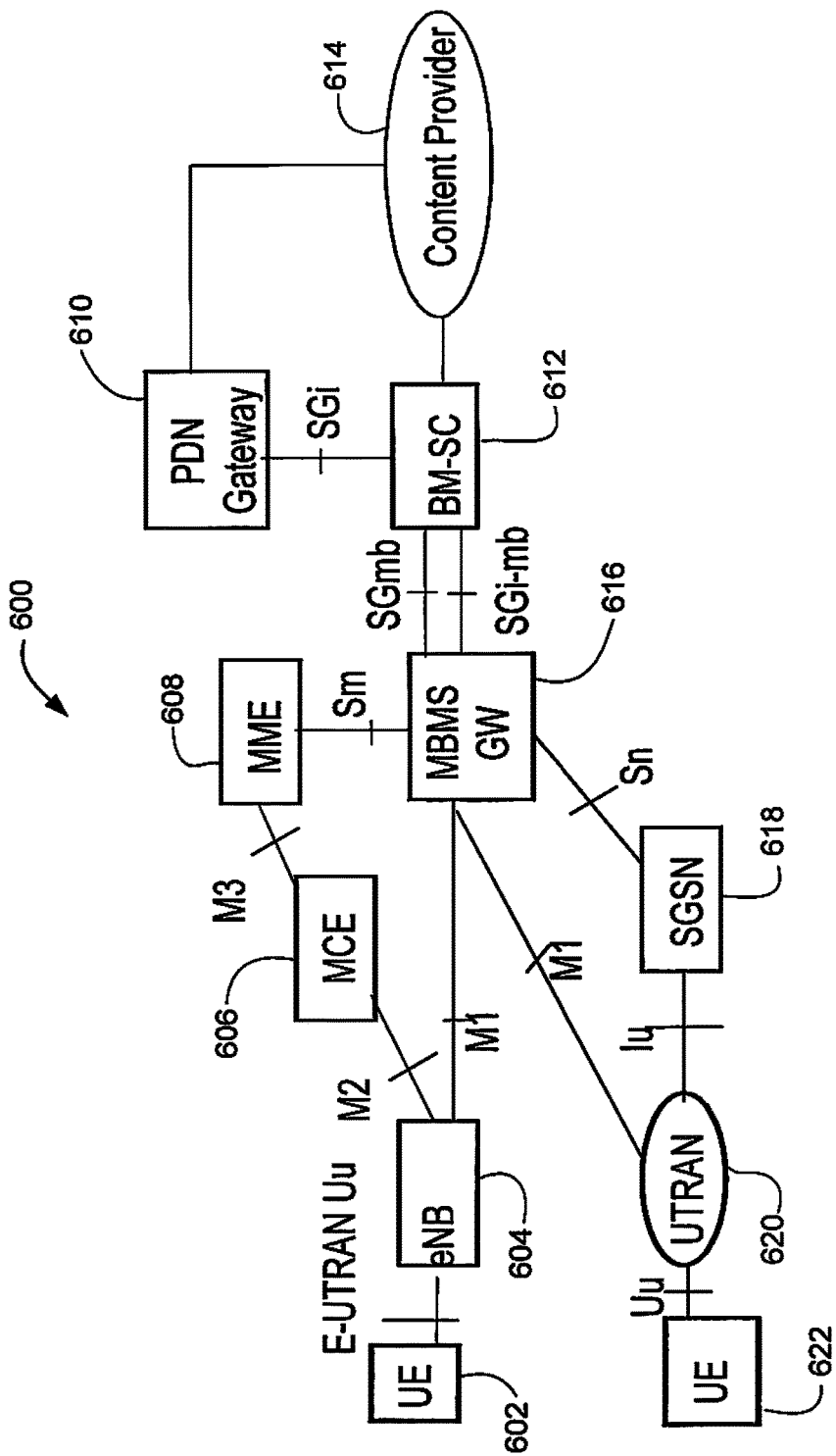
FIG. 6 is a block diagram illustrating components of a wireless communication system for providing or supporting MBSFN service.

FIG. 2 shows a down link frame structure used in LTE. The transmission timeline for the downlink may be partitioned into units of radio frames. Each radio frame may have a predetermined duration (e.g., 10 milliseconds (ms)) and may be partitioned into 10 subframes with indices of 0 through 9. Each subframe may include two slots. Each radio frame may thus include 20 slots with indices of 0 through 19. Each slot may include L symbol periods, e.g., 7 symbol periods for a normal cyclic prefix (CP), as shown in FIG. 2, or 6 symbol periods for an extended cyclic prefix. The normal CP and extended CP may be referred to herein as different CP types. The 2 L symbol periods in each subframe may be assigned indices of 0 through 2 L−1. The available time frequency resources may be partitioned into resource blocks. Each resource block may cover N subcarriers (e.g., 12 subcarriers) in one slot.

In LTE, an eNB may send a primary synchronization signal (PSS) and a secondary synchronization signal (SSS) for each cell in the eNB. The primary and secondary synchronization signals may be sent in symbol periods 6 and 5, respectively, in each of subframes 0 and 5 of each radio frame with the normal cyclic prefix, as shown in FIG. 2. The synchronization signals may be used by UEs for cell detection and acquisition. The eNB may send a Physical Broadcast Channel (PBCH) in symbol periods 0 to 3 in slot 1 of subframe 0. The PBCH may carry certain system information.

The eNB may send a Physical Control Format Indicator Channel (PCFICH) in only a portion of the first symbol period of each subframe, although depicted in the entire first symbol period in FIG. 2. The PCFICH may convey the number of symbol periods (M) used for control channels, where M may be equal to 1, 2 or 3 and may change from subframe to subframe. M may also be equal to 4 for a small system bandwidth, e.g., with less than 10 resource blocks. In the example shown in FIG. 2, M=3. The eNB may send a Physical HARQ Indicator Channel (PHICH) and a Physical Downlink Control Channel (PDCCH) in the first M symbol periods of each subframe (M=3 in FIG. 2). The PHICH may carry information to support hybrid automatic retransmission (HARQ). The PDCCH may carry information on resource allocation for UEs and control information for downlink channels. Although not shown in the first symbol period in FIG. 2, it is understood that the PDCCH and PHICH are also included in the first symbol period. Similarly, the PHICH and PDCCH are also both in the second and third symbol periods, although not shown that way in FIG. 2. The eNB may send a Physical Downlink Shared Channel (PDSCH) in the remaining symbol periods of each subframe. The PDSCH may carry data for UEs scheduled for data transmission on the downlink. The various signals and channels in LTE are described in 3GPP TS 36.211, entitled "Evolved Universal Terrestrial Radio Access (E-UTRA); Physical Channels and Modulation," which is publicly available.

The eNB may send the PSS, SSS and PBCH in the center 1.08 MHz of the system bandwidth used by the eNB. The eNB may send the PCFICH and PHICH across the entire system bandwidth in each symbol period in which these channels are sent. The eNB may send the PDCCH to groups of UEs in certain portions of the system bandwidth. The eNB may send the PDSCH to specific UEs in specific portions of the system bandwidth. The eNB may send the PSS, SSS, PBCH, PCFICH and PHICH in a broadcast manner to all UEs, may send the PDCCH in a unicast manner to specific UEs, and may also send the PDSCH in a unicast manner to specific UEs.

A number of resource elements may be available in each symbol period. Each resource element may cover one subcarrier in one symbol period and may be used to send one modulation symbol, which may be a real or complex value. Resource elements not used for a reference signal in each symbol period may be arranged into resource element groups (REGs). Each REG may include four resource elements in one symbol period. The PCFICH may occupy four REGs, which may be spaced approximately equally across frequency, in symbol period 0. The PHICH may occupy three REGs, which may be spread across frequency, in one or more configurable symbol periods. For example, the three REGs for the PHICH may all belong in symbol period 0 or may be spread in symbol periods 0, 1 and 2. The PDCCH may occupy 9, 18, 32 or 64 REGs, which may be selected from the available REGs, in the first M symbol periods. Only certain combinations of REGs may be allowed for the PDCCH.

A UE may know the specific REGs used for the PHICH and the PCFICH. The UE may search different combinations of REGs for the PDCCH. The number of combinations to search is typically less than the number of allowed combinations for the PDCCH. An eNB may send the PDCCH to the UE in any of the combinations that the UE will search.

A UE may be within the coverage of multiple eNBs. One of these eNBs may be selected to serve the UE. The serving eNB may be selected based on various criteria such as received power, path loss, signal-to-noise ratio (SNR), etc.

Figure 3:
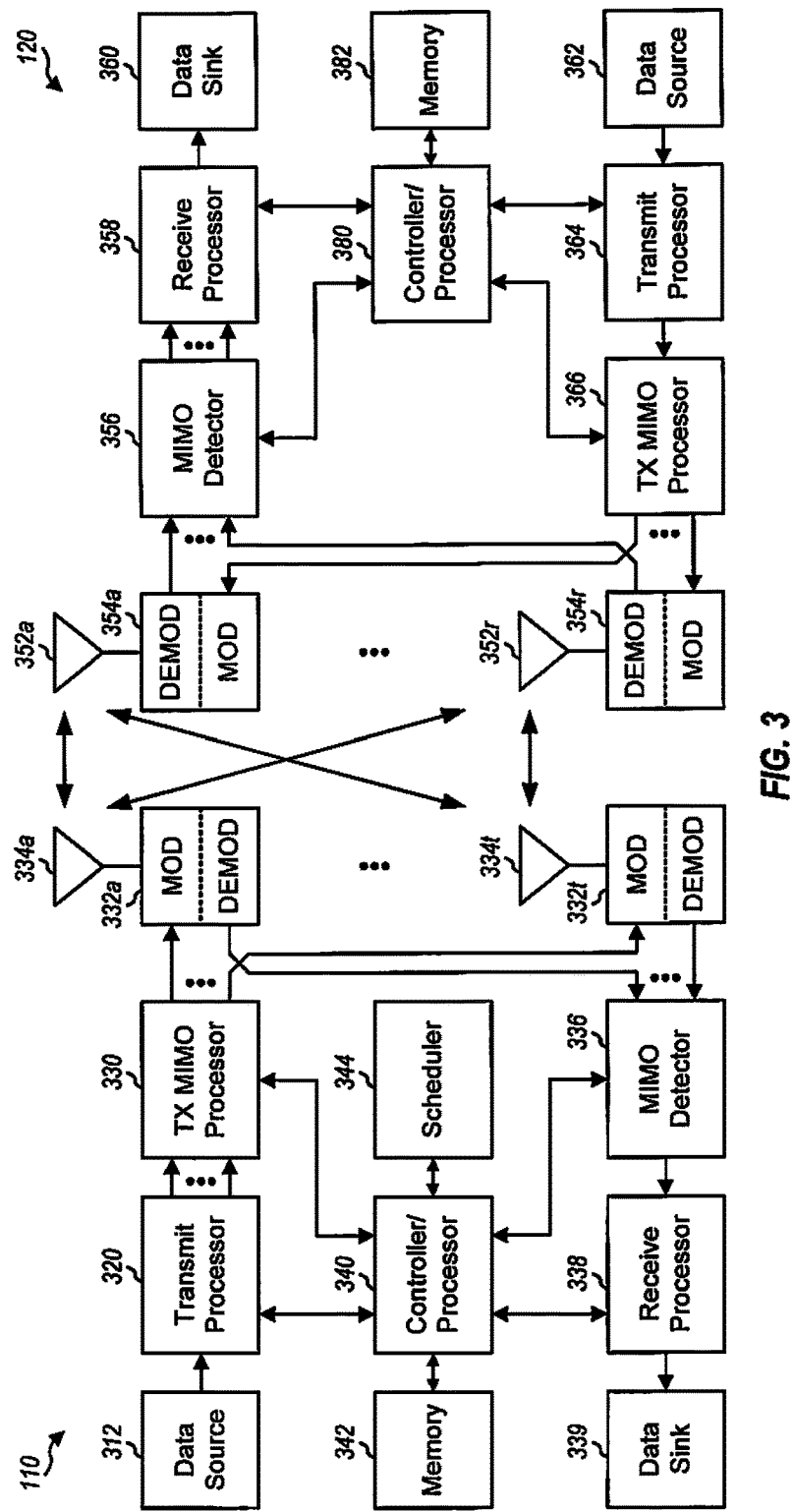
FIG. 3 is a block diagram conceptually illustrating a design of a base station/eNB and a UE configured according to one aspect of the present disclosure.

FIG. 3 shows a block diagram of a design of a base station/eNB 110 and a UE 120, which may be one of the base stations/eNBs and one of the UEs in FIG. 1. For a restricted association scenario, the base station 110 may be the macro eNB 110c in FIG. 1, and the UE 120 may be the UE 120y. The base station 110 may also be a base station of some other type. The base station 110 may be equipped with antennas 334a through 334t, and the UE 120 may be equipped with antennas 352a through 352r.

At the base station 110, a transmit processor 320 may receive data from a data source 312 and control information from a controller/processor 340. The control information may be for the PBCH, PCFICH, PHICH, PDCCH, etc. The data may be for the PDSCH, etc. The processor 320 may process (e.g., encode and symbol map) the data and control information to obtain data symbols and control symbols, respectively. The processor 320 may also generate reference symbols, e.g., for the PSS, SSS, and cell-specific reference signal. A transmit (TX) multiple-input multiple-output (MIMO) processor 330 may perform spatial processing (e.g., precoding) on the data symbols, the control symbols, and/or the reference symbols, if applicable, and may provide output symbol streams to the modulators (MODs) 332a through 332t. Each modulator 332 may process a respective output symbol stream (e.g., for OFDM, etc.) to obtain an output sample stream. Each modulator 332 may further process (e.g., convert to analog, amplify, filter, and upconvert) the output sample stream to obtain a downlink signal. Downlink signals from modulators 332a through 332t may be transmitted via the antennas 334a through 334t, respectively.

At the UE 120, the antennas 352a through 352r may receive the downlink signals from the base station 110 and may provide received signals to the demodulators (DEMODs) 354a through 354r, respectively. Each demodulator 354 may condition (e.g., filter, amplify, downconvert, and digitize) a respective received signal to obtain input samples. Each demodulator 354 may further process the input samples (e.g., for OFDM, etc.) to obtain received symbols. A MIMO detector 356 may obtain received symbols from all the demodulators 354a through 354r, perform MIMO detection on the received symbols if applicable, and provide detected symbols. A receive processor 358 may process (e.g., demodulate, deinterleave, and decode) the detected symbols, provide decoded data for the UE 120 to a data sink 360, and provide decoded control information to a controller/processor 380.

On the uplink, at the UE 120, a transmit processor 364 may receive and process data (e.g., for the PUSCH) from a data source 362 and control information (e.g., for the PUCCH) from the controller/processor 380. The processor 364 may also generate reference symbols for a reference signal. The symbols from the transmit processor 364 may be precoded by a TX MIMO processor 366 if applicable, further processed by the modulators 354a through 354r (e.g., for SC-FDM, etc.), and transmitted to the base station 110. At the base station 110, the uplink signals from the UE 120 may be received by the antennas 334, processed by the demodulators 332, detected by a MIMO detector 336 if applicable, and further processed by a receive processor 338 to obtain decoded data and control information sent by the UE 120. The processor 338 may provide the decoded data to a data sink 339 and the decoded control information to the controller/processor 340.

The controllers/processors 340 and 380 may direct the operation at the base station 110 and the UE 120, respectively. The processor 340 and/or other processors and modules at the base station 110 may perform or direct the execution of various processes for the techniques described herein. The processor 380 and/or other processors and modules at the UE 120 may also perform or direct the execution of the functional blocks illustrated in FIGS. 9A and 9B, and/or other processes for the techniques described herein. The memories 342 and 382 may store data and program codes for the base station 110 and the UE 120, respectively. A scheduler 344 may schedule UEs for data transmission on the downlink and/or uplink.

In one configuration, the UE 120 for wireless communication includes means for detecting interference from an interfering base station during a connection mode of the UE, means for selecting a yielded resource of the interfering base station, means for obtaining an error rate of a physical downlink control channel on the yielded resource, and means, executable in response to the error rate exceeding a predetermined level, for declaring a radio link failure. In one aspect, the aforementioned means may be the processor(s), the controller/processor 380, the memory 382, the receive processor 358, the MIMO detector 356, the demodulators 354a, and the antennas 352a configured to perform the functions recited by the aforementioned means. In another aspect, the aforementioned means may be a module or any apparatus configured to perform the functions recited by the aforementioned means.

One technique to facilitate high bandwidth communication for multimedia has been single frequency network (SFN) operation. Particularly, Multimedia Broadcast Multicast Service (MBMS) and MBMS for LTE, also known as evolved MBMS (eMBMS) (including, for example, what has recently come to be known as multimedia broadcast single frequency network (MBSFN) in the LTE context), can utilize such SFN operation. SFNs utilize radio transmitters, such as, for example, eNBs, to communicate with subscriber UEs. Groups of eNBs can transmit information in a synchronized manner, so that signals reinforce one another rather than interfere with each other. In the context of eMBMS, the shared content is transmitted from multiple eNB's of a LTE network to multiple UEs. Therefore, within a given eMBMS area, a UE may receive eMBMS signals from any eNB(s) within radio range as part of the eMBMS service area or MBSFN area. However, to decode the eMBMS signal each UE receives Multicast Control Channel (MCCH) information from a serving eNB over an eMBMS channel. MCCH information changes from time to time and notification of changes is provided through a non-eMBMS channel, the PDCCH. Therefore, to decode eMBMS signals within a particular eMBMS area, each UE is served MCCH and PDCCH signals by one of the eNBs in the area.

In accordance with aspects of the subject of this disclosure, there is provided a wireless network (e.g., a 3GPP network) having features relating to single carrier optimization for eMBMS. eMBMS provides an efficient way to transmit shared content from an LTE network to multiple mobile entities, such as, for example, UEs.

With respect a physical layer (PHY) of eMBMS for LTE Frequency Division Duplex (FDD), the channel structure may comprise time division multiplexing (TDM) resource partitioning between eMBMS and unicast transmissions on mixed carriers, thereby allowing flexible and dynamic spectrum utilization. Currently, a subset of subframes (up to 60%), known as multimedia broadcast single frequency network (MBSFN) subframes, can be reserved for eMBMS transmission. As such current eMBMS design allows at most six out of ten subframes for eMBMS.

Figure 4:
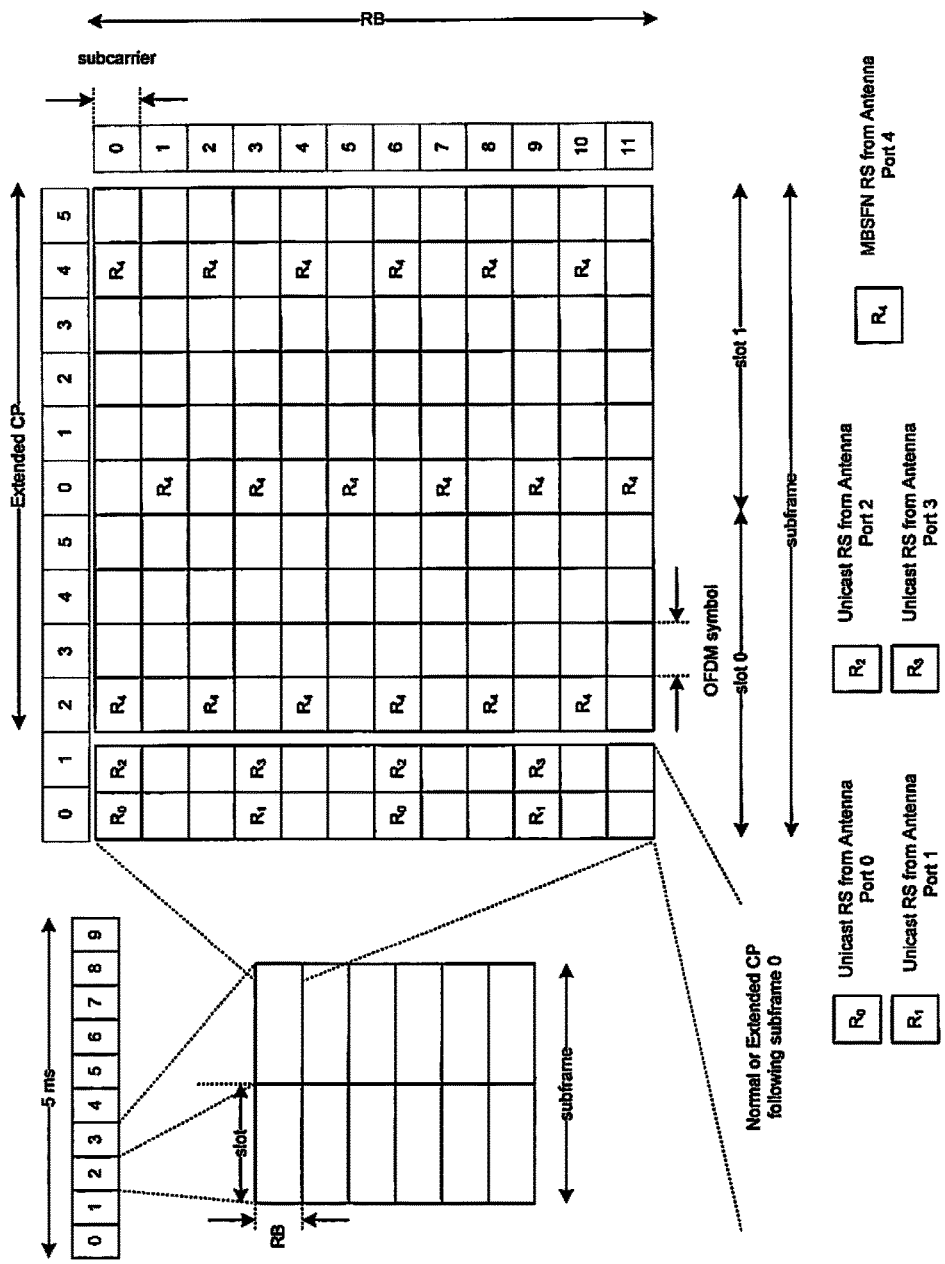
FIG. 4 is a diagram of a signaling frame illustrating an example of symbol allocation for unicast and multicast signals.

An example of subframe allocation for eMBMS is shown in FIG. 4, which shows an existing allocation of MBSFN reference signals on MBSFN subframes, for a single-carrier case. Components depicted in FIG. 4 correspond to those shown in FIG. 2, with FIG. 4 showing the individual subcarriers within each slot and resource block (RB). In 3GPP LTE, an RB spans 12 subcarriers over a slot duration of 0.5 ms, with each subcarrier having a bandwidth of 15 kHz together spanning 180 kHz per RB. Subframes may be allocated for unicast or eMBMS; for example in a sequence of subframes labeled 0, 1, 2, 3, 4, 5, 6, 7, 8, and 9, subframes 0, 4, 5, and 9 may be excluded from eMBMS in FDD. Also, subframes 0, 1, 5, and 6 may be excluded from eMBMS in time division duplex (TDD). More specifically, subframes 0, 4, 5, and 9 may be used for PSS/SSS/PBCH/paging/system information blocks (SIBs) and unicast service. Remaining subframes in the sequence, e.g., subframes 1, 2, 3, 6, 7, and 8 may be configured as eMBMS subframes.

With continued reference to FIG. 4, within each eMBMS subframe, the first 1 or 2 symbols may be used for unicast reference symbols (RSs) and control signaling. A CP length of the first 1 or 2 symbols may follow that of subframe 0. A transmission gap may occur between the first 1 or 2 symbols and the eMBMS symbols if the CP lengths are different. In related aspects, the overall eMBMS bandwidth utilization may be 42.5% considering RS overhead (e.g., 6 eMBMS subframes and 2 control symbols within each eMBMS subframe). Known techniques for providing MBSFN RSs and unicast RSs typically involve allocating the MBSFN RSs on MBSFN subframes (as shown in FIG. 4), and separately allocating unicast RSs on non-MBSFN subframes. More specifically, as FIG. 4 shows, the extended CP of the MBSFN subframe includes MBSFN RSs but not unicast RSs. The present technology is not limited to the particular frame allocation scheme illustrated by FIGS. 2 and 4, which are presented by way of example, and not by way of limitation. A multicast session or multicast broadcast as used herein may use any suitable frame allocation scheme.

Figure 5:
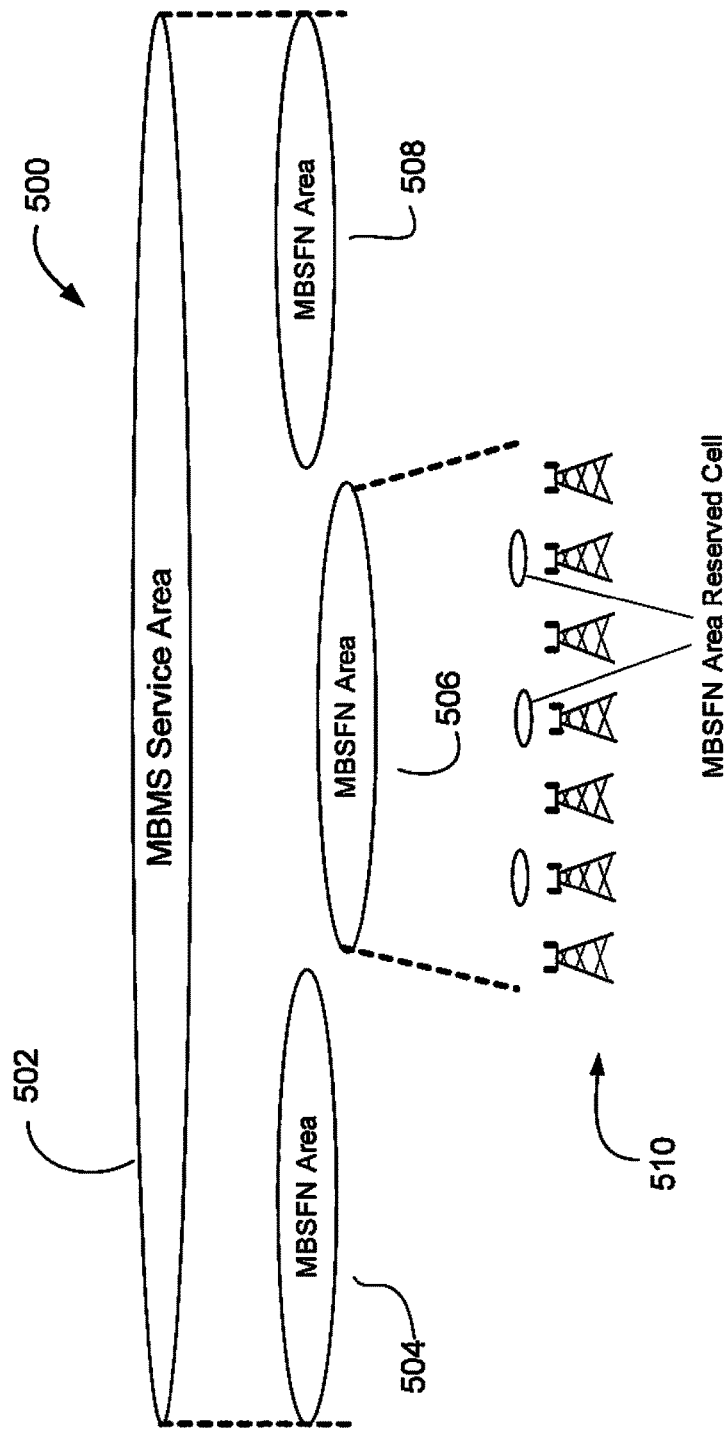
FIG. 5 is a diagram illustrating MBMS over a Single Frequency Network (MBSFN) areas within an MBSFN service area.

FIG. 5 illustrates a system 500 including an MBMS service area 502 encompassing multiple MBSFN areas 504, 506, 508, which themselves include multiple cells or base stations 510. As used herein, an "MBMS service area" refers to a group of wireless transmission cells where a certain MBMS service is available. For example, a particular sports or other program may be broadcast by base stations within the MBMS service area at a particular time. The area where the particular program is broadcast defines the MBMS service area. The MBMS service area may be made up of one or more "MBSFN areas" as shown at 504, 506 and 508. As used herein, an MBSFN area refers to a group of cells (e.g., cells 510) currently broadcasting a particular program in a synchronized fashion using an MBSFN protocol. An "MBSFN synchronization area" refers to a group of cells that are interconnected and configured in a way such that they are capable of operating in a synchronized fashion to broadcast a particular program using an MBSFN protocol, regardless of whether or not they are currently doing so. Each eNB can belong to only one MBSFN synchronization area, on a given frequency layer. It is worth noting that an MBMS service area 502 may include one or more MBSFN synchronization areas (not shown). Conversely, an MBSFN synchronization area may include one or more MBSFN areas or MBMS service areas. Generally, an MBSFN area is made up of all, or a portion of, a single MBSFN synchronization area and is located within a single MBMS service area. Overlap between various MBSFN areas is supported, and a single eNB may belong to several different MBSFN areas. For example, up to 8 independent MCCHs may be configured in System Information Block (SIB) 13 to support membership in different MBSFN areas. An MBSFN Area Reserved Cell or Base Station is a cell/base station within a MBSFN Area that does not contribute to the MBSFN transmission, for example a cell near a MBSFN Synchronization Area boundary, or a cell that that is not needed for MBSFN transmission because of its location.

FIG. 6 illustrates functional entities of a wireless communication system 600 for providing or supporting MBSFN service. Regarding Quality of Service (QoS), the system 600 uses a Guaranteed Bit Rate (GBR) type MBMS bearer, wherein the Maximum Bit Rate (MBR) equals the GBR. These components are shown and described by way of example, and do not limit the inventive concepts described herein, which may be adopted to other architectures and functional distributions for delivering and controlling multicast transmissions.

The system 600 may include an MBMS Gate Way (MBMS GW) 616. The MBMS GW 616 controls Internet Protocol (IP) multicast distribution of MBMS user plane data to eNodeBs 604 via an M1 interface; one eNB 604 of many possible eNBs is shown. In addition, the MBMS GW controls IP multicast distribution of MBMS user plane data to UTRAN 620 via an M1 interface. The M1 interface is associated to MBMS data (user plane) and makes use of IP for delivery of data packets. The eNB 604 may provide MBMS content to a user equipment (UE)/mobile entity 602 via an E-UTRAN Uu interface. The UTRAN 620 may provide MBMS content to a UE mobile entity 622 via a Uu interface. The MBMS GW 616 may further perform MBMS Session Control Signaling, for example MBMS session start and session stop, via the Mobility Management Entity (MME) 608 and Sm interface. The MBMS GW 616 may further provide an interface for entities using MBMS bearers through the SG-mb (user plane) reference point, and provide an interface for entities using MBMS bearers through the SGi-mb (control plane) reference point. The SG-mb Interface carries MBMS bearer service specific signaling. The SGi-mb interface is a user plane interface for MBMS data delivery. MBMS data delivery may be performed by IP unicast transmission, which may be a default mode, or by IP multicasting. The MBMS GW 616 may provide a control plane function for MBMS over UTRAN via a Serving General Packet Radio Service Support Node (SGSN) 618 and the Sn/Iu interfaces.

The system 600 may further include a Multicast Coordinating Entity (MCE) 606. The MCE 606 may perform an admission control function form MBMS content, and allocate time and frequency radio resources used by all eNBs in the MBSFN area for multi-cell MBMS transmissions using MBSFN operation. The MCE 606 may determine a radio configuration for an MBSFN Area, such as, for example, the modulation and coding scheme. The MCE 606 may schedule and control user plane transmission of MBMS content, and manage eMBMS service multiplexing, by determining which services are to be multiplexed in which Multicast Channel (MCH). The MCE 606 may participate in MBMS Session Control Signaling with the MME 608 through an M3 interface, and may provide a control plane interface M2 with the eNB 604.

The system 600 may further include a Broadcast-Multicast Service Center (BM-SC) 612 in communication with a content provider server 614. The BM-SC 612 may handle intake of multicast content from one or more sources such as the content provider 614, and provide other higher-level management functions as described below. These functions may include, for example, a membership function, including authorization and initiation of MBMS services for an identified UE. The BM-SC 612 may further perform MBMS session and transmission functions, scheduling of live broadcasts, and delivery, including MBMS and associated delivery functions. The BM-SC 612 may further provide service advertisement and description, such as advertising content available for multicast. A separate Packet Data Protocol (PDP) context may be used to carry control messages between UE and BM-SC. The BM-SC 612 may further provide security functions such as key management, manage charging of content providers according to parameters such as data volume and QoS, provide content synchronization for MBMS in UTRAN and in E-UTRAN for broadcast mode, and provide header compression for MBSFN data in UTRAN. The BM-SC 612 may indicate session start, update and stop to the MBMS-GW 616 including session attributes such as QoS and MBMS service area.

The system 600 may further include a Multicast Management Entity (MME) 608 in communication with the MCE 606 and MBMS-GW 616. The MME 608 may provide a control plane function for MBMS over E-UTRAN. In addition, the MME may provide the eNB 604 with multicast related information defined by the MBMS-GW 616. An Sm interface between the MME 608 and the MBMS-GW 616 may be used to carry MBMS control signaling, for example, session start and stop signals.

The system 600 may further include a Packet Data Network (PDN) Gateway (GW) 610, sometimes abbreviated as a P-GW. The P-GW 610 may provide an Evolved Packet System (EPS) bearer between the UE 602 and BM-SC 612 for signaling and/or user data. As such, the P-GW may receive Uniform Resource Locator (URL) based requests originating from UEs in association with IP addresses assigned to the UEs. The BM-SC 612 may also be linked to one or more content providers via the P-GW 610, which may communicate with the BM-SC 612 via an IP interface.

Modern mobile devices are often configured with one or more processors dedicated for transmission, reception, and decoding operations, such as a modem processor, and another one or more processors dedicated for the higher application layer, such as an application processor. In some example mobile devices, the modem and application processors are separate components or application-specific integrated circuits (ASICs), while on other example mobile devices, the modem and application processors may be integrated into the same integrated circuits, such as in System On Chip (SoC) configurations, and connected by a high speed bus.

Figure 7A:
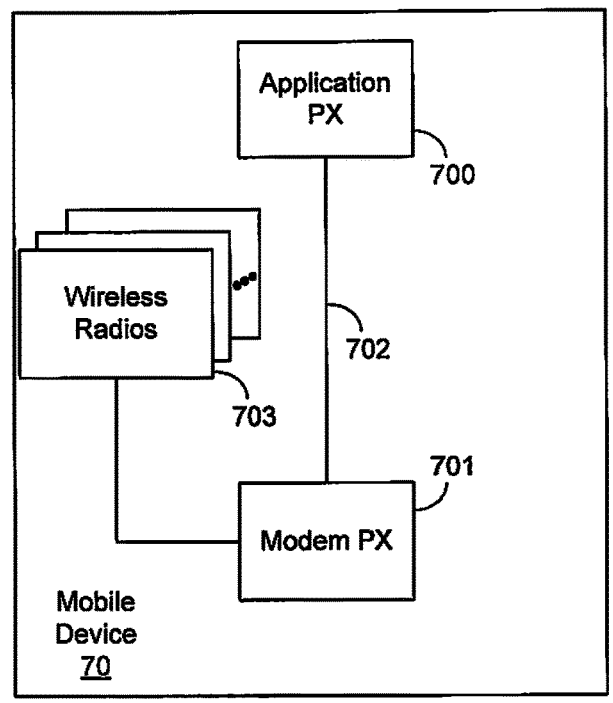
FIGS. 7A and 7B are block diagrams illustrating mobile devices configured with application and modem processors.
Figure 7B:
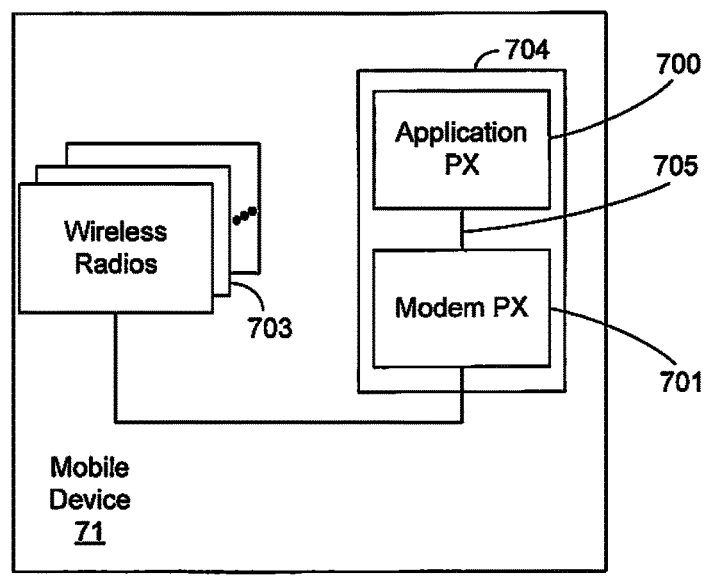

FIGS. 7A and 7B are block diagrams illustrating mobile devices 70 and 71 configured with application processor 700 and modem processor 701. Mobile device 70 is configured with application processor 700 as a separate component from modem processor 701. Applicant processor 700 and modem processor 701 are coupled in mobile device 70 through a regular bus 702. Modem processor 701 will control and operate operations through wireless radios 703, including transmission and reception of data as well as coding/decoding and modulating/demodulating the data for transmission and reception.

In contrast, mobile device 71 is configured with application processor 700 integrated into the same integrated circuit 704 as modem processor 701. In such SoC configuration, application processor 700 and modem processor 701 may be coupled via a high speed bus 705. A high speed bus is generally considered any connection between electronic components that allows data transfer over 1 Mbits/sec. High speed buses may be integrated into the same substrate as the integrated circuit components. Otherwise, if not integrated, a high speed bus may include a connection via a separate conductor that allows for the level of high speed data transfer that would qualify as "high speed" (e.g., ≥1 Mbits/s). Modem processor 701, in mobile device 71, will also then control and operate the transmission and reception functionality through wireless radios 703. Generally the modem processor is responsible for lower layer processing of a data stream received from a wireless network while the application layer processor is responsible for higher layer processing of the data stream.

Figures 8A, 8B:
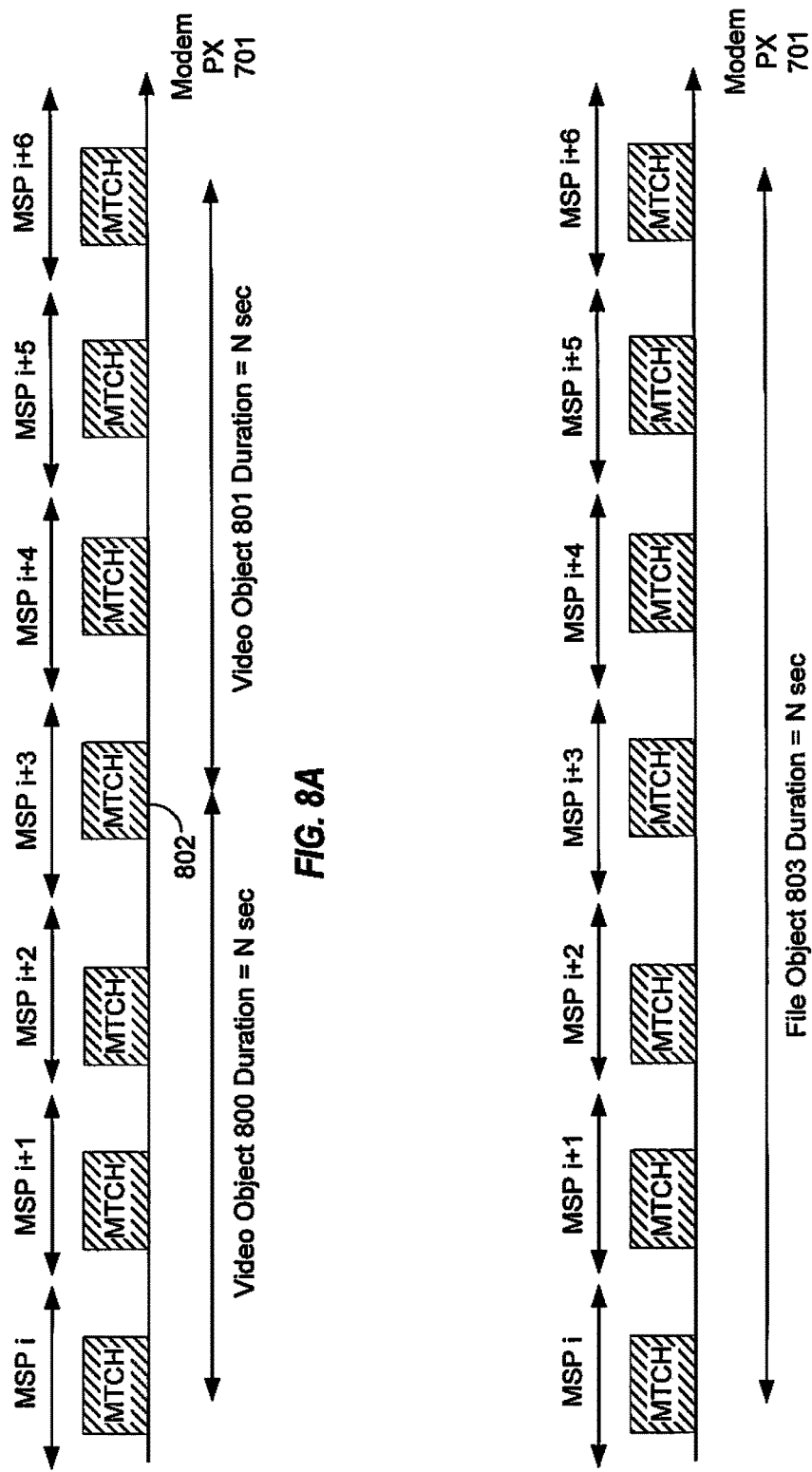
FIG. 8A is a block diagram illustrating a receiving stream of a modem processor for video streaming eMBMS.
FIG. 8B is a block diagram illustrating a receiving stream of a modem processor for a file download eMBMS.

Data may be delivered via MBMS using a file download delivery method or a streaming delivery method. FIG. 8A is a block diagram illustrating delivery of continuous multimedia data (e.g., a video data stream) over an MBMS bearer that may be received by a modem processor 701. The streaming video data in a broadcast-multicast service may be broken into smaller video objects, such as video objects 800 and 801, each with a duration of N. N may be various lengths of time, such as a number of whole seconds (e.g., 1, 2, 5, 10 sec, etc.), or a larger fraction of a second (e.g., 0.5, 0.75 sec, etc.) Each of video objects 800 and 801 may be further broken down into one or more source blocks, in which each source block may be made up of multiple forward error correction (FEC) data symbols.

In eMBMS systems, a MBMS service is scheduled for downlink transmission over the transmission period on a corresponding MBMS traffic channel (MTCH). Over a given streaming video duration, multiple MCH scheduling periods (MSP) may be scheduled during which the service will broadcast the streaming video data using the MTCH to transmit the source blocks of the streaming video data. As illustrated in FIG. 8A, seven MSPs are scheduled, during which the streaming video data is transmitted on the MTCH associated with the selected eMBMS service. The MTCH is multiplexed on the physical channel for transmission, which results in the MTCH being transmitted in multiplexed segments during the MSPs. Thus, the MTCH is not transmitted continuously on the transmission resource. Each segment of MTCH with the MSPs may include transmission of multiple data symbols. There are a certain number of FEC data symbols per data object. For example, each of video objects 800 and 801 may include 100 FEC data symbols. A video block may end during the middle of an MTCH transmission, where the next video block begins. As illustrated in FIG. 8A, video object 800 ends during the middle of MTCH 802, after which video object 801 begins, also in MTCH 802.

It should be noted that the example of 100 symbols per data object is merely an example. A data object may be set to include various numbers of symbols such as 60, 80, 150, and the like, in addition to 100. The number of symbols per data object may be determined through additional information contained in a file delivery table (FDT) associated with the broadcast-multicast service. For example, the FDT includes the encoding symbol length. Using this information, the application processor may determine the number of symbols per data object by dividing the IP packet size without any of the header bits (e.g., FLUTE, UDP, and IP header size bits) by the encoding symbol length. The result of the calculation corresponds to the number of symbols per data object.

FIG. 8B is a block diagram illustrating a file download over a MBMS bearer that may be received by modem processor 701. File object 802 may have a duration that lasts until the content of the file has finished transmission. Data symbols making up file object 802 may be transmitted during each of the MTCH within the MSP periods. When all of the symbols of the file have been transmitted, modem processor 701 will stop the reception process.

When a mobile device receives data over the eMBMS, such as video streaming data (FIG. 8A) or file download data (FIG. 8B), the modem processor, such as modem processor 701, receives and decodes downlink eMBMS Internet protocol (IP) packets transmitted on the MTCH and forwards the received, successfully decoded IP packets to the application processor for further processing by a higher layer protocol, e.g., a file delivery over unidirectional transport (FLUTE) protocol. In video streaming or file download services using the FLUTE protocol, the data may be transported as FLUTE file object(s) with forward error correction (FEC) redundancy added. The added FEC redundancy may be used to recover data loss due to channel conditions. FEC adds redundant data symbols that are transmitted with the source data symbols, such that if data symbol loss occurs during decoding or reception, the level of redundancy allows the application processor to re-assemble the data objects.

For example, a particular video object or file object may include 1000 source symbols. Depending on the redundancy level selected for FEC, there will be additional FEC symbols transmitted along with the 1000 source symbols. In one example, a 50% redundancy level may be selected by the eMBMS system. In such instances, the 1000 source symbols will be transmitted with another 500 redundant symbols for a total of 1500 data symbols for the video or file object. Various redundancy levels may be selected depending on different variables, such as channel quality, data priority, quality of service, and the like. In other examples, a 25% redundancy level may be selected, which would add another 250 redundant symbols to the 1000 source symbols, or a 60% redundancy would add another 600 redundant symbols to the 1000 source symbols. Note that the redundancy level may be selected to account for worst case channel conditions of a mobile device in a fringe area or edge of reception.

However, with the additional redundant symbols, it may be possible for a mobile device with better channel quality to receive enough of the transmitted symbols to reassemble the data object before all of the data symbols of the data object have been received. In such case, a mobile device configured according to various aspects of the present disclosure may be able to terminate reception of the remaining data symbols on the MTCH (prior to receiving all of the data symbols intended or scheduled for transmission (all the source symbols plus the redundant FEC symbols)). The mobile device may, therefore, be able to stop processing at either or both of the application processor and modem processor, thereby, conserving power and resources at the mobile device.

FIG. 9A is a block diagram illustrating example blocks executed to implement one aspect of the present disclosure. At block 900, a modem processor, such as modem processor 701, successfully receives a plurality of IP packets for a data object transmission from a broadcast-multicast service. When the mobile device tunes to a broadcast-multicast service, the modem processor will begin receiving and decoding the MTCH carrying a MBMS data transmission to recover IP packets with the data symbols carried in the payload portion of the IP packet.

At block 901, the modem processor forwards the plurality of successfully received IP packets to an application processor, such as application processor 700, associated with the modem processor. The application processor includes the higher layer application protocols for further processing the content of the FEC data symbols contained in the IP packets.

At block 902, the modem processor receives a first modification signal from the application processor when a number of the successfully received FEC data symbols exceeds a threshold data level. The threshold data level represents the minimum number of successfully received FEC data symbols that allows the application processor to assemble the entire data object. Because the transmission of the FEC data symbols include redundant data symbols as well as the source data symbols, the application processor may be able to assemble/reassemble the entire data object before receiving all of the data symbols scheduled for transmission. The threshold data level may be determined according to the following relationship:

$$Nrx \geq Nsr + O, \quad (1)$$

where Nrx represents the number of successfully received FEC data symbols, Nsr is the number of source symbols of the data object, and O represents a predetermined number of overhead symbols associated with a particular error coding algorithm used to achieve a particular redundancy level. The redundancy level may be set to account for the number of overhead symbols and additional redundancy symbols to account for a maximum recoverable error rate due to varying channel conditions. Depending on the complexity of the error coding algorithm used, the predetermined number of overhead symbols may add a varying number of additional redundancy symbols over the number of source symbols, Nsr, in order to successfully assemble/reassemble the entire data object with a high degree of probability (e.g., 99.9999%). In one example implementation, an error coding algorithm known as Raptor10 would be associated with an additional 24 overhead symbols (O=24), while in another example implementation, an error coding algorithm known as RaptorQ would be associated with only an additional 3 overhead symbols (O=3). Thus, once the number of successfully received symbols, Nrx, satisfies the relationship identified in equation (1), the application server would be able to successfully assemble the entire data object. As described later, a redundancy level is set to add additional redundancy symbols to allow for variations in error rate due to varying channel conditions.

At block 903, the modem processor ceases forwarding any additional IP packets for the data object to the application processor in response to the first modification signal. The modification signal instructs the modem processor to stop sending the received IP packets including the FEC data symbols to the application processor.

FIG. 9B is a block diagram illustrating example blocks executed to implement one aspect of the present disclosure. At block 904, an application processor, such as application processor 700, obtains a total number of source symbols, Nsr, and a redundancy level for a data object to be received from a broadcast-multicast service. The number of source symbols, Nsr, may be determined and, thus, obtained by the application process using information obtained from the FDT associated with the MBMS service. For example, the FDT includes the transfer length of the corresponding streaming video or download file for transfer in the broadcast-multicast service. As noted above, the FDT also includes the encoding symbol length. The number of source symbols, Nsr, may be obtained by dividing the transfer length by the encoding symbol length. The resulting number represents the number of encoded source symbols from encoding the total length of data.

At block 905, the application processor receives a plurality of IP packets including the received data symbols of the broadcast-multicast service via an associated modem processor, such as modem processor 701. As noted above, as the mobile device tunes to the broadcast-multicast service, the modem processor begins receiving and decoding IP packets carrying the data symbols. Each of the IP packets that has been successfully decoded by the modem processor is sent to the application processor for higher layer processing.

At block 906, the application processor determines that a number of the plurality of received data symbols carried in the IP packets exceeds a threshold data level. As indicated above, the threshold data level is satisfied when the number of data symbols successfully received by the application processor, Nrx, satisfies the relationship identified in equation (1).

At block 907, the application processor signals the modem processor to cease forwarding further received data symbols of the data object. Processing time by at least the application processor may be conserved as soon as the relationship identified in equation (1) has been satisfied. The application processor would signal the modem processor to stop sending received data symbols for this data object.

For scenarios when the broadcast-multicast service is a file download, the modem processor may completely stop receiving/decoding IP packets on the MTCH for the corresponding data object. In such scenarios, both the application processor and modem processor may conserve processing time once the threshold data level has been reached. In alternative scenarios, when the broadcast-multicast service is a streaming video, the modification signal instructs the modem processor to stop forwarding received IP packets, but can also either cause the modem processor to stop receiving/recovering the remaining IP packets for the current video segment or simply to stop forwarding the recovered IP packets while continuing to receive/recover the IP packets. The modem processor would then begin forwarding the received IP packets for the next video segment which occurs at the beginning of the next segment boundary.

Various methods may be used in order to detect the start of a segment. For example, in one example method, the application or modem processor may first detect any segment boundary (e.g., segment start or segment end). Having detected a segment boundary, the next segment start may be predicted using a recurrent timer. The mobile device will know the segment duration for any given broadcast-multicast service through information obtained either from the FDT or user service description (USD) file maintained for the broadcast-multicast service. Thus, with the segment boundary detected, the application processor or modem processor will begin the segment timer, which will expire after the segment duration has lapsed. The next segment start may then be predicted when the timer expires. The recurrent timer may count up to the segment duration or may count down after being set to the segment duration. The various aspects of the present disclosure are not limited to one such implementation of recurrent timer mechanism.

Figure 10:
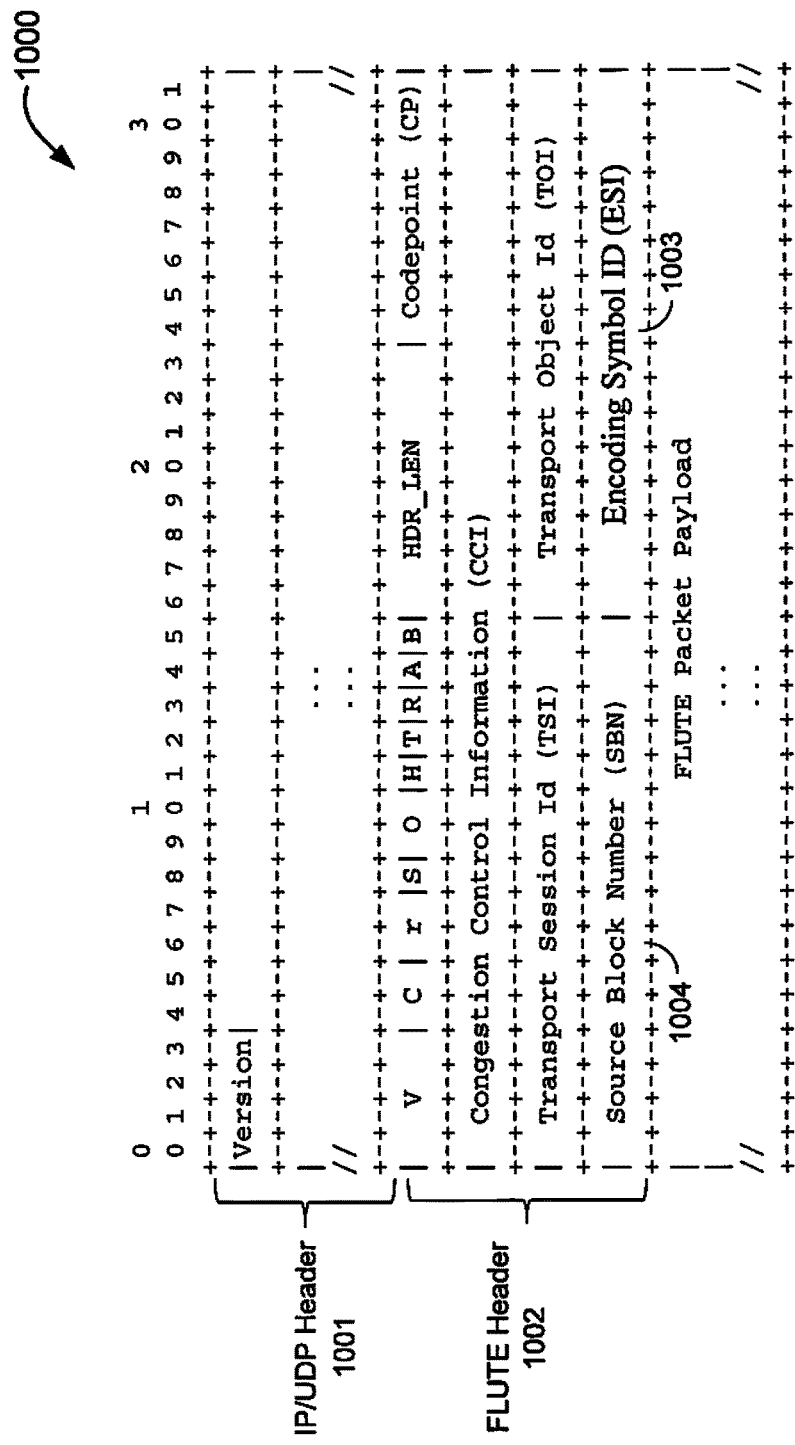
FIG. 10 is a block diagram illustrating an example data packet of a broadcast-multicast service transmission.

FIG. 10 is a block diagram illustrating an example data packet 1000 of a broadcast-multicast service transmission. In an alternative method for detecting the start of a segment, a modem processor, such as modem processor 701, may perform deep packet inspection of data packet 1000 in order to obtain an encoding symbol identifier (ESI) 1003. In deep packet inspection, the modem processor reads through IP/UDP header 1001 into FLUTE header 1002 in order to obtain ESI 1003 and SBN 1004. ESI 1003 indicates the index of the current symbol of the data block transmitted in data packet 1000. SBN 1004 indicates the index of the data block. ESI 1003 and SBN 1004 will be set to 0 at the beginning of a data segment. Therefore, when the modem processor detects that ESI 1003 is set to 0 (and SBN 1004 is set to 0 for large object size) through deep packet inspection, the modem processor will begin forwarding the received IP packets to the application processor. Alternatively, the application processor may, through the higher layer operations, read FLUTE header 1002 to obtain ESI 1003 and inform the modem processor of the segment start.

Figure 11:
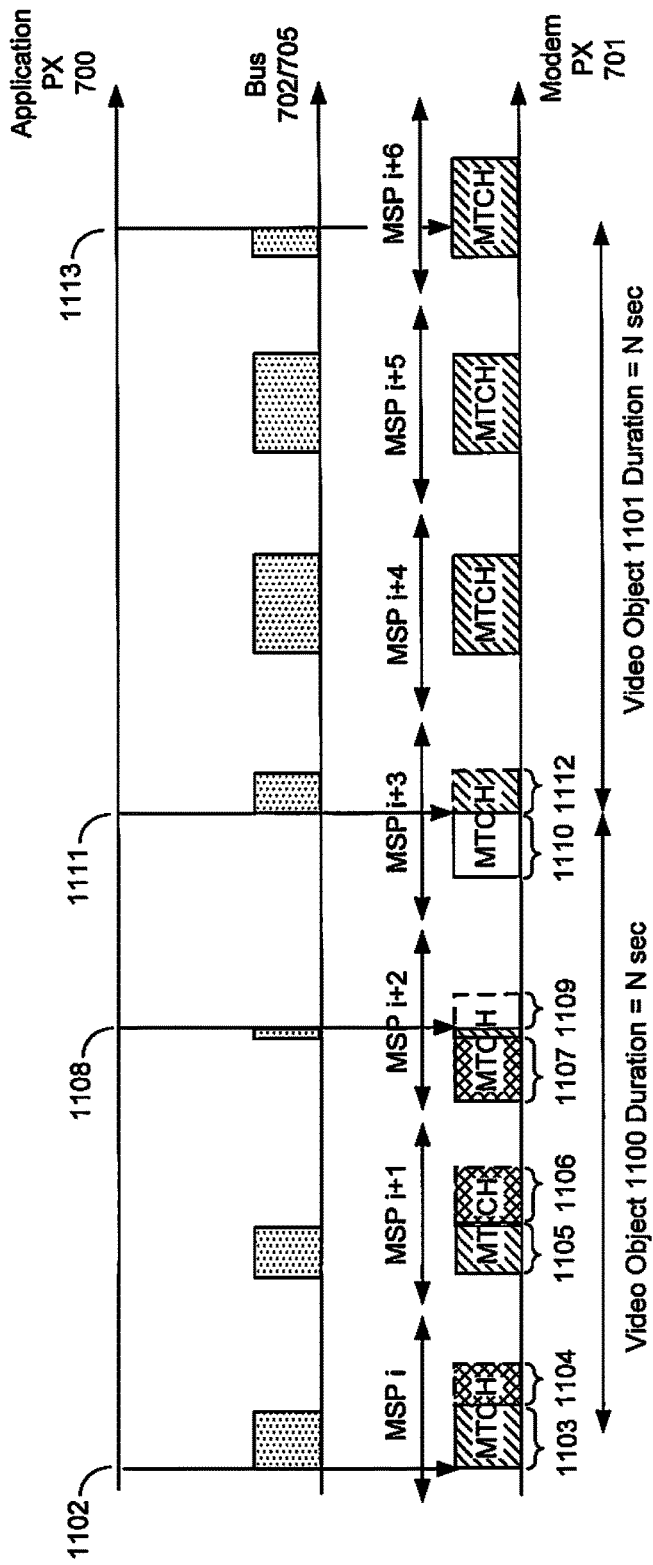
FIGS. 11-13 are block diagrams illustrating communication streams of application and modem processors configured according to aspects of the present disclosure.

FIG. 11 is a block diagram illustrating communication streams of application processor 700 and modem processor 701 configured according to one aspect of the present disclosure. Application processor 700 and modem processor 701 are coupled via a bus, such as bus 702 or high speed bus 705 (FIGS. 7A & 7B). In addition to conserving processing time when the number of successfully received symbols exceeds the threshold data level relationship identified in equation (1), processing time may also be conserved when there is excess data loss of the transmitted data object.

Application processor 700 can determine the total number of symbols designated for the FEC encoded data object, Ntot, including the source symbols, Nsr, and redundancy symbols (Ntot−Nsr). For example, as noted above, the FDT packet for each data object can provide the transfer length of the data object as well as the encoding symbol length. The FDT packet may also include the FEC redundancy level. The redundancy level may also be signaled in the USD file for the broadcast-multicast service. For example, if the redundancy level is set to 20% then the FEC encoded data object includes an additional 20% redundancy symbols. The application processor may, therefore, determine the total number of FEC data symbols of the encoded data object according to the following equation:

$$Ntot = Nsr * (1 + \text{FEC redundancy level}/100\%) \quad (2)$$

It may further be assumed that the network sends the FEC redundancy symbols according to an increasing ESI and source block number (SBN) from the starting point of 0. Thus, application processor 700 may obtain the symbol ID, X, of the current successfully received IP packet using ESI 1003 (FIG. 10) of data packet 1000. The current symbol ID may either be the value of ESI 1003 if there is only one source block per object, or, if there are multiple source blocks per object, then the current symbol ID may be determined by application processor 700 according to the following equations:

$$X = \Sigma_{i=0}^{k} N(i) + ESI, \quad (3)$$

where N(t) is the number of symbols per source block index i, k is number of source blocks completed so far, and ESI is the symbol ID within the current source block.

When data loss occurs, application processor 700 may only be able to successfully assemble or reassemble the data object if the number of successfully received FEC data symbols meets or exceeds a threshold failure point. A threshold failure point represents the minimum number of symbols that application processor 700 can use to successfully assemble or reassemble the data object. As indicated above, this minimum level of symbols for assembling or reassembling the data object is the number of source symbols, Nsr, plus the predetermined overhead value, O. Application processor 700 may, therefore, monitor for the threshold failure point according to the following relationship:

$$Nrx + Ntot - (X + L) < Nsr + O \quad (4)$$

Thus, if the total number of successfully received symbols, Nrx, plus the total number of remaining symbols yet to receive (Ntot−(X+L)) does not meet or exceed the threshold failure point, application processor 700 stops processing and signals modem processor 701 to stop forwarding further received IP packets with the FEC data symbols for the current data object (e.g., a second modification signal that triggers modem processor 701). Both application processor 700 and modem processor 701 will then wait for the next data object or video data segment to begin.

The total number of remaining FEC data symbols to receive for the encoded data object may be determined by application processor 700 using the current symbol ID, X, and the known number of symbols per IP packet, L. The number of symbols per IP packet, L, may also be determined by application processor 700 from information obtained in the FDT. For example, application processor 700 may determine the number of symbols per IP packet, L, by dividing the IP packet size without any of the header bits (total IP packet size—FLUTE header size—IP header size) by the encoding symbol length.

Referring back to FIG. 11, at time 1102, after having detected a previous segment boundary, modem processor 701 starts the recurring timer for the beginning of the segment for video object 1100. Modem processor 701 also begins successfully receiving IP packets with the FEC data symbols on the MTCH, successfully receiving the IP packets sent within period 1103. At period 1104, however, modem processor 701 fails to properly decode the received IP packet. Without successfully received IP packets, modem processor 701 stops forwarding IP packets with the FEC data symbols to application processor 700 via bus 702/705 at the beginning of period 1104. In the next MTCH during MSP i+1, modem processor 701 again successfully receives the IP packet with the FEC symbols during period 1105, but cannot successfully receive the symbols in period 1106 of the MTCH Modem processor 701 continues with unsuccessfully receiving data symbols during period 1107 of the next MTCH during MSP i+2. Prior to time 1108, application processor 700 receives some data symbol with current symbol ID, X. At time 1108, application processor 700 determines that the number of symbols successfully received, Nrx, will not meet or exceed the threshold failure point determined according to equation (4). Thus, at time 1108, application processor 700 will send a signal to modem processor 701 to stop forwarding received IP packets.

In response to the signal, modem processor 701 not only stops forwarding received IP packets to application processor 700, but stops receiving/decoding any incoming signals for the remaining period 1109 of the MSP i+2. Video object 1100 includes additional IP packets with FEC data symbols that are transmitted in the next MTCH of MSP i+3. However, because modem processor 701 has stopped receiving/decoding because of the failure to meet the threshold failure point, modem processor 701 will not receive/recover any IP packets including data symbols during period 1110.

At time 1111, however, the recurrent timer expires at modem processor 701 indicating the beginning of the next video segment in video object 1101. In response to the timer expiring, modem processor 701 begins receiving/recovering IP packets on the MTCH of MSP i+3 for video object 1101. Modem processor 701 will begin to forward the successfully received IP packets again to application processor 700 via bus 702/706. The forwarded IP packet from modem processor 701 may serve to wake application processor 700 from a power saving mode, due to the failure to reach the previous threshold failure point. At time 1113, application processor 700 determines that the threshold data level has been reached according to the relationship represented in equation (1) and signals modem processor 701 to stop forwarding the received IP packets. Modem processor 701 will continue to receive/recover IP packets, but will not forward the received IP packets to application processor until the next video segment.

It should be noted that in alternative aspects of the present disclosure, when the threshold failure point has not been met and modem processor 701 has ceased receiving/recovering IP packets, application processor 700 may operate the recurrent timer and, once the timer has expired, send another modification signal to modem processor 701 (e.g., a third modification signal), which triggers modem processor 701 to restart the receiving/recovering IP packets as the beginning of the next segment.

Figure 12:
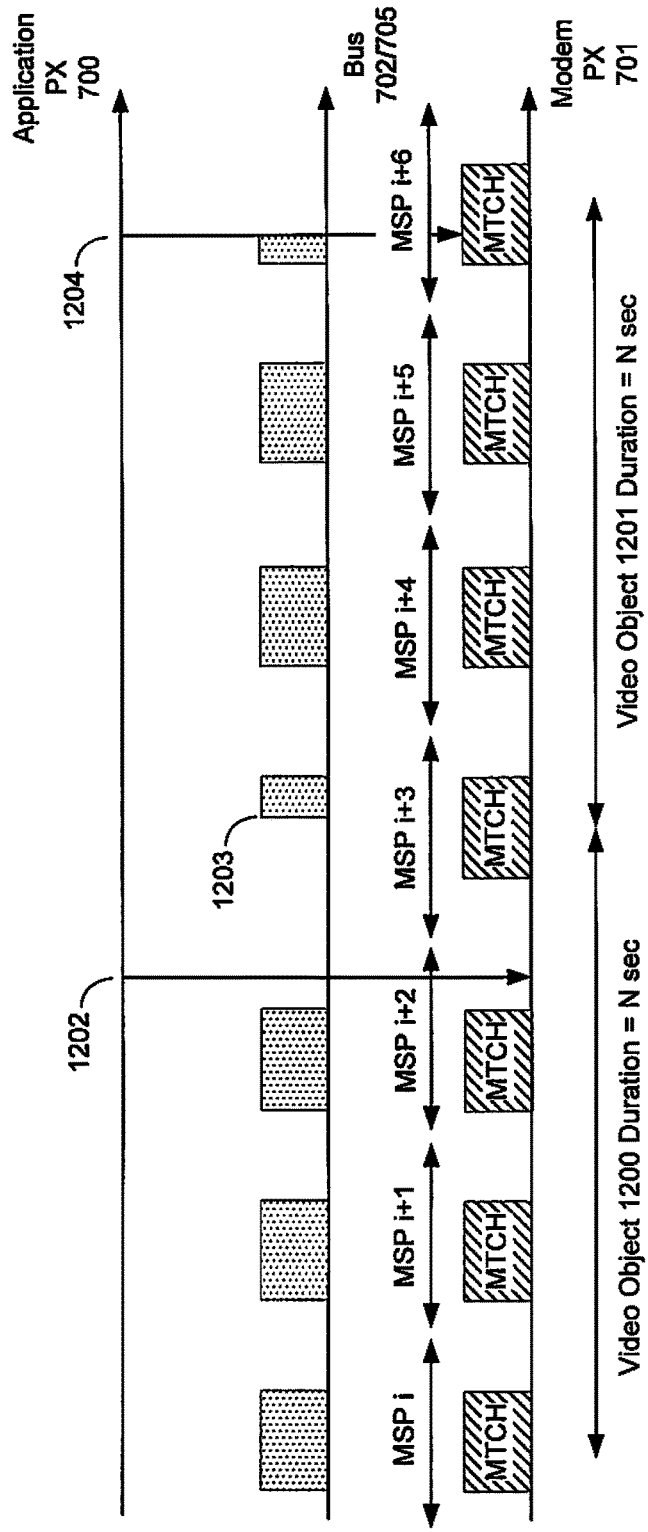

FIG. 12 is a block diagram illustrating communication streams of application processor 700 and modem processor 701 configured according to one aspect of the present disclosure. Application processor 700 and modem processor 701 are coupled via a bus, such as bus 702 or high speed bus 705 (FIGS. 7A & 7B). The mobile device at which application processor 700 and modem processor 701 are located tunes to a streaming video service. Modem processor 701 begins to receive the MBMS transmission and recover IP packets with the data symbols for video object 1200. The successfully received IP packets are then forwarded to application processor 700 over bus 702/705. At time 1202, application processor 700 determines that the number of successfully received symbols, Nrx, meets the conditions for equation (1), thus reaching the threshold data level for being capable of fully assembling or reassembling video object 1200. Application processor 700 signals modem processor 701 to stop forwarding any additional received IP packets containing FEC data symbols for video object 1200. Modem processor 701 continues to receive/recover IP packets during the remaining MTCH for video object, but does not forward those IP packets to the application processor.

At time 1203, with the beginning of the new data segment for video object 1201, modem processor 701 begins to forward the received IP packets again to application processor 700. Modem processor 701 continues to forward received IP packets until receiving another modification signal from application processor 700 at 1204, when, again, application processor 700 determines that the conditions for the threshold data level being met in equation (1) are met.

Figure 13:
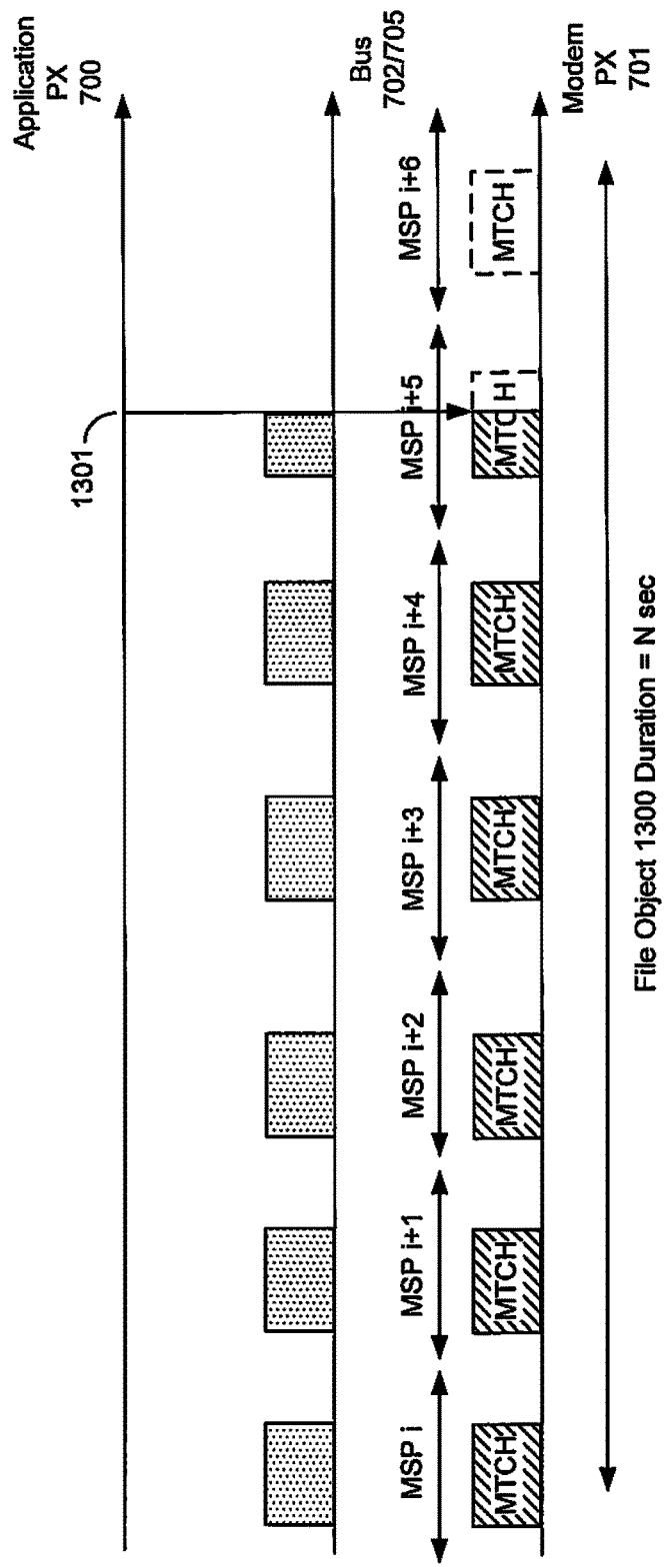

FIG. 13 is a block diagram illustrating communication streams of application processor 700 and modem processor 701 configured according to one aspect of the present disclosure. Application processor 700 and modem processor 701 are coupled via a bus, such as bus 702 or high speed bus 705 (FIGS. 7A & 7B). The mobile device at which application processor 700 and modem processor 701 are located is configured to receive a file download service. The file download service includes FEC encoded file object 1300. Modem processor 701 will begin to receive the MBMS transmission carrying the file download service and recover IP packets transmitted for file object 1300 on the corresponding MTCH. The successfully received IP packets are forwarded to application processor 700 via bus 702/705. At time 1301, application processor determines that the total number of successfully received symbols, Nrx, meets the relationship according to equation (1). Application processor 700 will then send a modification signal to modem processor 701 to stop forwarding received IP packets for file object 1300 for the remaining N duration. Upon receipt of the modification signal, modem processor 701 not only stops forwarding received IP packets to application processor 700, but stops all receiving/decoding of any signals associated with file object 1300.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and process steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or process described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. A computer-readable storage medium may be any available media that can be accessed by a general purpose or special purpose computer. By way of example, and not limitation, such computer-readable storage media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, non-transitory connections may properly be included within the definition of computer-readable medium. For example, if the instructions are transmitted from a website, server, or other remote source using a coaxial cable, fiber optic cable, twisted pair, or digital subscriber line (DSL), then the coaxial cable, fiber optic cable, twisted pair, or DSL are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

As used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination. Also, as used herein, including in the claims, "or" as used in a list of items (for example, a list of items prefaced by a phrase such as "at least one of" or "one or more of") indicates a disjunctive list such that, for example, a list of "at least one of A, B, or C" means A or B or C or AB or AC or BC or ABC (i.e., A and B and C) and any combinations thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A method of wireless communication, comprising:
   obtaining, by an application processor, a total number of source symbols and a redundancy level for a data object to be received from a broadcast-multicast service;
   receiving a plurality of received data symbols of the data object from the broadcast-multicast service via a modem processor associated with the application processor;
   determining, by the application processor, that a number of the plurality of received data symbols exceeds a threshold data level greater than the total number of source symbols and less than a total number of data symbols for transmission of the data object, wherein the total number of data symbols comprises the total number of source symbols and a total number of redundancy symbols determined by the redundancy level; and
   signaling, by the application processor in response to the determining, the modem processor to cease forwarding further received data symbols for the data object received from the broadcast-multicast service.

2. The method of claim 1, wherein the threshold data level comprises the total number of source symbols plus a predetermined overhead value, wherein the predetermined overhead value is based on an error coding algorithm associated with the redundancy level.

3. The method of claim 1, further including:
   monitoring an error rate of unsuccessfully receiving one or more data symbols of the data object; and
   signaling the modem processor to cease forwarding further received data symbols for the data object when the error rate reaches a threshold failure point, wherein the threshold failure point is based on the number of the plurality of received data symbols plus a remaining number of symbols left to receive failing to reach the threshold data level.

4. The method of claim 3, wherein the signaling the modem processor to cease forwarding triggers the modem processor to stop receiving and decoding data until a next scheduled data object.

5. The method of claim 4, further including:
   detecting a segment boundary of at least one of the plurality of received data symbols;
   starting a segment timer in response to detecting the segment boundary, wherein the segment timer is set to a segment length; and
   signaling the modem processor to begin receiving and decoding data for the next scheduled data object in response to expiration of the segment timer.

6. A method of wireless communication, comprising:
   successfully receiving a plurality of data symbols for a data object transmission from a broadcast-multicast service at a modem processor;
   forwarding the plurality of successfully received data symbols to an application processor associated with the modem processor;
   receiving a first modification signal from the application processor when a number of the plurality of successfully received data symbols exceeds a threshold data level greater than a total number of source symbols and less than a total number of data symbols for transmission of the data object; and ceasing to forward any additional data symbols for the data object to the application processor in response to the first modification signal.

7. The method of claim 6, wherein the threshold data level comprises the total number of source symbols plus a predetermined overhead value, wherein the predetermined overhead value is based on an error coding algorithm associated with a redundancy level of the data object transmission from the broadcast-multicast service.

8. The method of claim 6, further including:
receiving a second modification signal from the application processor when an error rate in receiving one or more data symbols of the data object reaches a threshold failure point, wherein the threshold failure point is based on the number of the plurality of successfully received data symbols plus a remaining number of symbols left to receive failing to reach the threshold data level; and
ceasing to forward any additional data symbols for the data object to the application processor in response to the second modification signal.

9. The method of claim 8, further including:
ceasing to receive data symbols for the data object at the modem processor in response to either of the first or second modification signals until a next scheduled data object.

10. The method of claim 9, further including:
restarting to receive and decode one or more data symbols of the next scheduled data object, wherein the restarting is in response to one of:
receiving a third modification signal from the application processor; or
determining, at the modem processor, a segment start of the next scheduled data object.

11. The method of claim 10, wherein the determining the segment start of the next scheduled data object includes:
detecting the segment start by the modem processor using deep packet inspection of one or more data symbols received for the next scheduled data object from the broadcast-multicast service.

12. The method of claim 10, wherein the determining the segment start of the next scheduled data object includes:
detecting a segment boundary of at least one of the plurality of successfully received data symbols using deep packet inspection;
starting a segment timer in response to detecting the segment boundary, wherein the segment timer is set to a segment length, wherein the segment start occurs on expiration of the segment timer.

13. An apparatus configured for wireless communication, the apparatus comprising:
at least one processor; and
a memory coupled to the at least one processor,
wherein the at least one processor is configured:
to obtain, by an application processor, a total number of source symbols and a redundancy level for a data object to be received from a broadcast-multicast service;
to receive a plurality of received data symbols of the data object from the broadcast-multicast service via a modem processor associated with the application processor;

to determine, by the application processor, that a number of the plurality of received data symbols exceeds a threshold data level greater than the total number of source symbols and less than a total number of data symbols for transmission of the data object, wherein the total number of data symbols comprises the total number of source symbols and a total number of redundancy symbols determined by the redundancy level; and
to signal the modem processor, by the application processor in response to the determination, to cease forwarding further received data symbols for the data object received from the broadcast-multicast service.

14. The apparatus of claim 13, wherein the threshold data level comprises the total number of source symbols plus a predetermined overhead value, wherein the predetermined overhead value is based on an error coding algorithm associated with the redundancy level.

15. The apparatus of claim 13, further including configuration of the at least one processor:
to monitor an error rate of unsuccessfully receiving one or more data symbols of the data object; and
to signal the modem processor to cease forwarding further received data symbols for the data object when the error rate reaches a threshold failure point, wherein the threshold failure point is based on the number of the plurality of received data symbols plus a remaining number of symbols left to receive failing to reach the threshold data level.

16. The apparatus of claim 15, wherein the configuration of the at least one processor to signal the modem processor to cease forwarding triggers the modem processor to stop receiving and decoding data until a next scheduled data object.

17. The apparatus of claim 16, further including configuration of the at least one processor:
to detect a segment boundary of at least one of the plurality of received data symbols;
to start a segment timer in response to detecting the segment boundary, wherein the segment timer is set to a segment length; and
to signal the modem processor to begin receiving and decoding data for the next scheduled data object in response to expiration of the segment timer.

18. An apparatus configured for wireless communication, the apparatus comprising:
at least one processor; and
a memory coupled to the at least one processor,
wherein the at least one processor is configured:
to successfully receive a plurality of data symbols for a data object transmission from a broadcast-multicast service at a modem processor;
to forward the plurality of successfully received data symbols to an application processor associated with the modem processor;
to receive a first modification signal from the application processor when a number of the plurality of successfully received data symbols exceeds a threshold data level greater than a total number of source symbols and less than a total number of data symbols for transmission of the data object; and
to cease to forward any additional data symbols for the data object to the application processor in response to the first modification signal.

19. The apparatus of claim 18, wherein the threshold data level comprises the total number of source symbols plus a predetermined overhead value, wherein the predetermined overhead value is based on an error coding algorithm associated with a redundancy level of the data object transmission from the broadcast-multicast service.

20. The apparatus of claim 18, further including configuration of the at least one processor:
  to receive a second modification signal from the application processor when an error rate in receiving one or more data symbols of the data object reaches a threshold failure point, wherein the threshold failure point is based on the number of the plurality of successfully received data symbols plus a remaining number of symbols left to receive failing to reach the threshold data level; and
  to cease to forward any additional data symbols for the data object to the application processor in response to the second modification signal.

21. The apparatus of claim 20, further including configuration of the at least one processor to cease to receive data symbols for the data object at the modem processor in response to either of the first or second modification signals until a next scheduled data object.

22. The apparatus of claim 21, further including configuration of the at least one processor to restart to receive and decode one or more data symbols of the next scheduled data object, wherein the configuration to restart is executed in response to configuration of the at least one processor to one of:
  receive a third modification signal from the application processor; or
  determine, at the modem processor, a segment start of the next scheduled data object.

23. The apparatus of claim 22, wherein the configuration of the at least one processor to determine the segment start of the next scheduled data object configuration to detect the segment start by the modem processor using deep packet inspection of one or more data symbols received for the next scheduled data object from the broadcast-multicast service.

24. The apparatus of claim 22, wherein the configuration of the at least one processor to determine the segment start of the next scheduled data object includes configuration of the at least one processor.

* * * * *